(12) United States Patent
Kitagawa

(10) Patent No.: US 10,739,678 B2
(45) Date of Patent: Aug. 11, 2020

(54) PHOTOCURABLE COMPOSITION, PATTERN FORMING METHOD, AND METHOD FOR MANUFACTURING DEVICE

(71) Applicant: FUJIFILM Corporation, Tokyo (JP)

(72) Inventor: Hirotaka Kitagawa, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 47 days.

(21) Appl. No.: 15/852,363

(22) Filed: Dec. 22, 2017

(65) Prior Publication Data

US 2018/0120698 A1    May 3, 2018

Related U.S. Application Data

(63) Continuation of application No. PCT/JP2016/069205, filed on Jun. 29, 2016.

(30) Foreign Application Priority Data

Jun. 30, 2015 (JP) .................... 2015-132094

(51) Int. Cl.

| | | |
|---|---|---|
| C08F 2/50 | (2006.01) | |
| H01L 23/29 | (2006.01) | |
| G03F 7/027 | (2006.01) | |
| C08F 20/00 | (2006.01) | |
| C09D 4/00 | (2006.01) | |
| G03F 7/00 | (2006.01) | |
| C08F 220/30 | (2006.01) | |
| C08F 236/16 | (2006.01) | |
| C08F 290/06 | (2006.01) | |
| C09J 11/04 | (2006.01) | |
| C09J 11/06 | (2006.01) | |
| C30B 29/38 | (2006.01) | |
| G03F 7/038 | (2006.01) | |

(Continued)

(52) U.S. Cl.
CPC .............. G03F 7/027 (2013.01); C08F 2/50 (2013.01); C08F 20/00 (2013.01); C08F 220/30 (2013.01); C08F 236/16 (2013.01); C08F 290/06 (2013.01); C09D 4/00 (2013.01); C09J 11/04 (2013.01); C09J 11/06 (2013.01); C30B 29/38 (2013.01); G03F 7/0002 (2013.01); G03F 7/038 (2013.01); H01L 23/29 (2013.01); H01L 23/293 (2013.01); H01L 23/31 (2013.01); H05K 3/287 (2013.01); H01L 21/0337 (2013.01); H05K 3/064 (2013.01)

(58) Field of Classification Search
CPC ........ G03F 7/027; G03F 7/0002; G03F 7/038; C08F 236/16; C08F 290/06; C08F 2/48; C08F 20/00; H01L 23/296; H01L 23/31; H01L 23/29; H01L 21/0337; C09J 11/04; C09J 11/06; H05K 3/287; H05K 3/064

See application file for complete search history.

(56) References Cited

U.S. PATENT DOCUMENTS

2001/0000140 A1    4/2001 Yamashita et al.
2007/0218406 A1*   9/2007 Mizutani ............... G03F 7/0392
                                                                430/270.1

(Continued)

FOREIGN PATENT DOCUMENTS

JP    S58-68743 A    4/1983
JP    2-134337 A     5/1990

(Continued)

OTHER PUBLICATIONS

Stevens (Polymer Chemistry: An introduction, 3rd ed., Oxford, p. 172) (Year: 1999).*
Machine English translation of Ikemoto et al. (JP 09-110790) (Year: 1997).*
CAS Registry No. 949567-70-8, STN®, Nov. 5, 2018, 4 pages.
Office Action dated Nov. 8, 2018 issued by the Korean Intellectual Property Office in counterpart Korean application No. 10-2017-7037214.
Stephen Y. Chou et al., "Imprint of sub-25 nm vias and trenches in polymers," Appl. Phys. Lett., Nov. 20, 1995, pp. 3114-3116, vol. 67, No. 21.

(Continued)

Primary Examiner — Jessica M Roswell
(74) Attorney, Agent, or Firm — Sughrue Mion, PLLC

(57) ABSTRACT

Provided are a photocurable composition capable of suppressing both deformation (change in line width roughness (ΔLWR)) of a pattern after etching and breakage of a pattern after etching, a pattern forming method, and a method for manufacturing a device. Disclosed is a photocurable composition including a monofunctional (meth)acrylate represented by the following General Formula (I) and a photopolymerization initiator, where $R^1$ represents a hydrogen atom or a methyl group; $R^2$ represents an alkyl group which may be substituted with a fluorine atom, $R^3$ represents a hydrogen atom, a linear alkyl group which may be substituted with a fluorine atom, or a branched alkyl group which may be substituted with a fluorine atom, $R^4$ to $R^8$ each independently represent a hydrogen atom, a halogen atom, a linear alkyl group having 1 to 4 carbon atoms, or a branched alkyl group having 3 or 4 carbon atoms, the total number of carbon atoms included in $R^2$ and $R^3$ is 1 to 6, and $R^2$ and $R^3$, or $R^2$ and $R^4$ may be bonded to each other and form a ring.

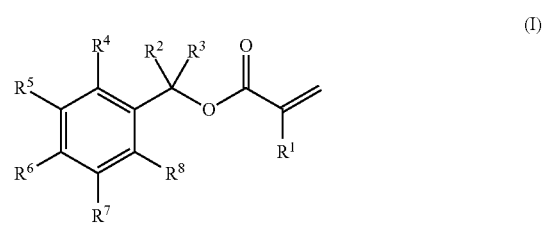

(I)

12 Claims, No Drawings

(51) Int. Cl.
*H01L 23/31* (2006.01)
*H05K 3/28* (2006.01)
*H01L 21/033* (2006.01)
*H05K 3/06* (2006.01)

(56) References Cited

U.S. PATENT DOCUMENTS

| | | | |
|---|---|---|---|
| 2008/0096134 A1* | 4/2008 | Sugimoto | G03F 7/0045 430/287.1 |
| 2010/0009287 A1 | 1/2010 | Kodama | |
| 2011/0236595 A1 | 9/2011 | Kodama et al. | |
| 2012/0003590 A1 | 1/2012 | Hirano et al. | |
| 2014/0080058 A1* | 3/2014 | Cameron | G03F 7/027 430/281.1 |
| 2014/0220353 A1 | 8/2014 | Kodama et al. | |
| 2014/0234646 A1 | 8/2014 | Devasenapathi et al. | |
| 2014/0255662 A1 | 9/2014 | Enomoto et al. | |
| 2014/0374884 A1 | 12/2014 | Kitagawa et al. | |

FOREIGN PATENT DOCUMENTS

| | | |
|---|---|---|
| JP | H09-110790 A | 4/1997 |
| JP | 2010-159369 A | 7/2010 |
| JP | 2010-186979 A | 8/2010 |
| JP | 2010-256853 A | 11/2010 |
| JP | 2012-032762 A | 2/2012 |
| JP | 2014-530277 A | 11/2014 |
| KR | 10-2015-0003187 A | 1/2015 |
| TW | 201336874 A | 9/2013 |
| WO | 97/036196 A1 | 10/1997 |
| WO | 2013/047136 A1 | 4/2013 |
| WO | 2015/159442 A1 | 10/2015 |

OTHER PUBLICATIONS

Jan Haisma et al., "Mold-assisted nanolithography: A process for reliable pattern replication," J. Vac. Sci. Technol. B, Nov./Dec. 1996, pp. 4124-4129, vol. 14, No. 6 (total 3 pages).
M. Colburn et al., "Step and Flash Imprint Lithography: A New Approach to High-Resolution Patterning," Proc. SPIE, Mar. 1999, pp. 379-389, vol. 3676.
H. Gokan et al., "Dry Etch Resistance of Organic Materials," J. Electrochem. Soc.: Solid-State Science and Technology, Jan. 1983, pp. 143-146, vol. 130, No. 1.
Written Opinion of the International Searching Authority dated Jul. 26, 2016, in counterpart International Application No. PCT/JP2016/069205.
International Preliminary Report on Patentability dated Jan. 2, 2018, in counterpart International Application No. PCT/JP2016/069205.
International Search Report of PCT/JP2016/069205 dated Jul. 26, 2016.
Notification of Reasons for Refusal dated Feb. 26, 2019 from the Japanese Patent Office in Japanese application No. 2017-526383.
Office Action dated Sep. 3, 2019, from the Japanese Patent Office in counterpart Japanese application No. 2017-526383.
Office Action dated May 10, 2019, from the Korean Intellectual Property Office in counterpart Korean application No. 10-2017-7037214.
Office Action dated Mar. 30, 2020, from the Taiwanese Intellectual Property Office in Taiwan application No. 105120094.
Office Action dated Jan. 15, 2020 from the Taiwanese Intellectual Property Office in TW Application No. 105120094.

* cited by examiner

PHOTOCURABLE COMPOSITION, PATTERN FORMING METHOD, AND METHOD FOR MANUFACTURING DEVICE

CROSS-REFERENCE TO RELATED APPLICATIONS

This application is a Continuation of PCT International Application No. PCT/JP2016/069205 filed on Jun. 29, 2016, which claims priority under 35 U.S.C § 119(a) to Japanese Patent Application No. 2015-132094 filed on Jun. 30, 2015. Each of the above application(s) is hereby expressly incorporated by reference, in its entirety, into the present application.

BACKGROUND OF THE INVENTION

1. Field of the Invention

The present invention relates to a photocurable composition. The invention also relates to a pattern forming method and a method for manufacturing a device, both methods using a photocurable composition.

2. Description of the Related Art

Imprint methods constitute a technology resulting from further development of embossing technology that is known in connection with the production of optical discs, which is a technology capable of accurately transferring a micropattern of a prototype mold (generally referred to as mold, stamper, or template) having a concavo-convex pattern formed thereon. This technology is economically efficient because once a mold is produced, a microstructure such as a nanostructure can be molded simply and repeatedly, and in recent years, the technology is expected to be applied to a variety of fields.

Regarding the imprint method, a thermal imprint method of using a thermoplastic resin (see, for example, S. Chou et al., Appl. Phys. Lett., 67, 3114 (1995)) and a photo-imprint method of using a photocurable composition (see, for example, J. Haisma et al., J. Vac. Sci. Technol. B 14(6), 4124 (1996); and M. Colbun et al., Proc. SPIE 3676, 379 (1999)) have been proposed. A thermal imprint method includes transferring a microstructure onto a resin by pressing at high pressure a mold into a thermoplastic resin that has been heated to a temperature higher than or equal to the glass transition temperature, subsequently cooling the system to a temperature lower than or equal to the glass transition temperature, and then detaching the mold.

Meanwhile, a photo-imprint method includes transferring a micropattern onto a cured product by exposing a photocurable composition to ultraviolet radiation (UV) through a light-transmissive mold or a light-transmissive substrate, while the photocurable composition is in a state of being interposed between a substrate and a mold, thereby curing the photocurable composition, and then detaching the mold. Since this method enables imprinting at room temperature, the method can be applied to the field of precision processing of ultramicropatterns, such as the production of semiconductor integrated circuits.

A method of microprocessing a substrate using an imprint pattern as an etching mask is referred to as nanoimprint lithography (NIL), and development of such methods is underway (see, for example, JP2010-159369A and JP2010-186979A).

Meanwhile, it is described in J. Electrochem. Soc. 130, 143 (1983) that the etching rate of a resist material correlates with the Ohnishi parameter (Ohnishi P).

SUMMARY OF THE INVENTION

Here, in recent years, there is a tendency with regard to photocurable compositions for imprint that are used for applications of performing dry etching processing, such as semiconductor applications, that suppression of both deformation (change in line width roughness (ΔLWR)) of a pattern after etching and breakage of a pattern after etching is required. However, it cannot be necessarily said that conventional photocurable compositions are satisfactory in this regard.

The present invention is intended to solve such problems, and an object of the invention is to provide a photocurable composition which enables suppression of both deformation (ΔLWR) of a pattern after etching and breakage of a pattern after etching.

Under such circumstances, the inventors of the present invention conducted a thorough investigation, and as a result, the inventors found that the object described above can be achieved by using a particular monofunctional (meth) acrylate that will be described below, thus completing the invention. Specifically, the problems were solved by the following means <1>, and preferably by <2> to <14>.

<1> A photocurable composition comprising:
a monofunctional (meth)acrylate represented by the following General Formula (I); and
a photopolymerization initiator,

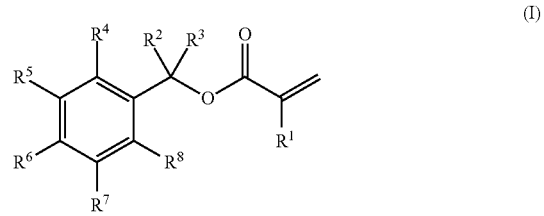

(I)

where $R^1$ represents a hydrogen atom or a methyl group,
$R^2$ represents an alkyl group which may be substituted with a fluorine atom,
$R^3$ represents a hydrogen atom, a linear alkyl group which may be substituted with a fluorine atom, or a branched alkyl group which may be substituted with a fluorine atom,
$R^4$ to $R^8$ each independently represent a hydrogen atom, a halogen atom, a linear alkyl group having 1 to 4 carbon atoms, or a branched alkyl group having 3 or 4 carbon atoms,
the total number of carbon atoms included in $R^2$ and $R^3$ is 1 to 6, and
$R^2$ and $R^3$, or $R^2$ and $R^4$ may be bonded to each other and form a ring.

<2> The photocurable composition according to <1>, in which in General Formula (I), $R^4$ represents a linear alkyl group having 1 to 4 carbon atoms, or a branched alkyl group having 3 or 4 carbon atoms.

<3> The photocurable composition according to <1> or <2>, in which in General Formula (I), $R^3$ represents a hydrogen atom.

<4> The photocurable composition according to <1> or <2>, in which in General Formula (I), $R^2$ and $R^3$ each independently represent a methyl group which may be substituted with a fluorine atom.

<5> The photocurable composition according to <1> or <2>, in which the monofunctional (meth)acrylate is represented by the following General Formula (II):

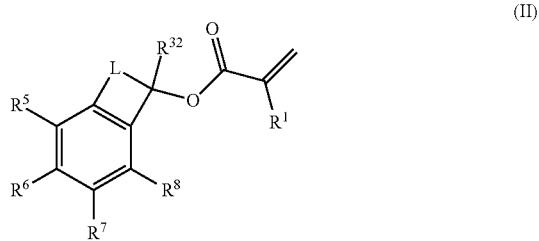

where $R^1$ represents a hydrogen atom or a methyl group,

L represents a linear alkylene group or a branched alkylene group, $R^{32}$ represents a hydrogen atom, a linear alkyl group, or a branched alkyl group, $R^5$ to $R^8$ each independently represent a hydrogen atom, a halogen atom, a linear alkyl group having 1 to 4 carbon atoms, or a branched alkyl group having 3 or 4 carbon atoms, and the total number of carbon atoms included in L and $R^{32}$ is 1 to 6.

<6> The photocurable composition according to any one of <1> to <5>, in which the photocurable composition includes the monofunctional (meth)acrylate at a proportion of 20% to 80% by mass with respect to all the components except for the solvent in the photocurable composition.

<7> The photocurable composition according to any one of <1> to <6>, in which the photocurable composition further includes a polyfunctional (meth)acrylate at a proportion of 20% to 79% by mass with respect to all the components except for the solvent in the photocurable composition.

<8> The photocurable composition according to <7>, in which the polyfunctional (meth)acrylate has an aromatic group.

<9> The photocurable composition according to any one of <1> to <8>, in which the Ohnishi parameter of the photocurable composition is 3.6 or less, and the glass transition temperature of a cured film of the photocurable composition is 85° C. or higher, provided that the glass transition temperature of the cured film is a value measured by the following method:

the photocurable composition is interposed between quartz plates and is cured with ultraviolet radiation using a high-pressure mercury lamp as a light source under the conditions of a wavelength of 300 to 400 nm, an illuminance of 10 mW/cm², and an exposure time of 100 seconds, thereby a cured film in the form of a short strip sample having a film thickness of 150 μm and a width of 5 mm is produced, the dynamic viscoelasticity of the short strip sample is measured in the tensile sinusoidal mode using a dynamic viscoelasticity analyzer under the conditions of a distance between chucks of 20 mm, a temperature range of 20° C. to 220° C., a rate of temperature increase of 5° C./min, and a frequency of 1 Hz, and the temperature at the maximum value of a loss tangent curve thus obtained is designated as the glass transition temperature; and the Ohnishi parameter is a value represented by the following Expression (1):

Ohnishi parameter=Total number of atoms/(number of carbon atoms−number of oxygen atoms)  (1).

<10> The photocurable composition according to any one of <1> to <9>, in which the viscosity at 23° C. of the photocurable composition is 5.5 to 15.0 mPa·s.

<11> The photocurable composition according to any one of <1> to <10>, for use in imprint applications.

<12> A pattern forming method, comprising:

a step of applying the photocurable composition according to any one of <1> to <11> on a base material or a mold having a pattern;

a step of interposing the photocurable composition between the mold and the base material;

a step of irradiating the photocurable composition with light in a state of being interposed between the mold and the base material and thereby curing the photocurable composition; and a step of detaching the mold.

<13> The pattern forming method according to <12>, in which the photocurable composition is applied on the base material or the mold having a pattern, by an inkjet method.

<14> A method for manufacturing a device, the method comprising a step of etching the base material by using a pattern produced by the pattern forming method according to <12> or <13> as a mask.

According to the invention, a photocurable composition capable of suppressing both deformation (change in line width roughness (ΔLWR)) of a pattern after etching and breakage of a pattern after etching, a pattern forming method, and a method for manufacturing a device can be provided.

DESCRIPTION OF THE PREFERRED EMBODIMENTS

In the following description, the content of the invention will be explained in detail. The explanation of the constituent elements described below is based on representative embodiments of the invention; however, the invention is not intended to be limited to those embodiments.

The symbol "-" used in the present specification is used to mean to include the values described before and after the symbol as the lower limit and the upper limit.

According to the present specification, the term "(meth)acrylate" represents acrylate and methacrylate, the term "(meth)acryl" represents acryl and methacryl, and the term "(meth)acryloyl" represents acryloyl and methacryloyl.

The term "imprint" according to the present specification preferably means the transfer of a pattern having a size of 1 nm to 100 μm, and more preferably means the transfer of a pattern having a size of 10 nm to 1 μm (nanoimprint).

In regard to the description of a group (atomic group) in the present specification, any description that does not indicate substitution and unsubstitution, except for the monofunctional (meth)acrylate represented by General Formulae (I) and (II) described below, is meant to include a group that does not have any substituent as well as a group that has a substituent. For example, the description "alkyl group" is meant to include an alkyl group that does not have any substituent (unsubstituted alkyl group) as well as an alkyl group that has a substituent (substituted alkyl group).

According to the present specification, the term "light" includes light having a wavelength in the ultraviolet region, far-ultraviolet region, visible light region, infrared region, and the like, and electromagnetic waves as well as radiation. Examples of the radiation include microwaves, an electron beam, extreme ultraviolet radiation (EUV), and X-ray. Laser light of a 248-nm excimer laser, a 193-nm excimer laser, a 172-nm excimer laser, and the like can also be used. This light may be monochromatic light (single wavelength light) that has passed through an optical filter, or light having a plurality of different wavelengths (composite light).

According to the present specification, unless particularly stated otherwise, the number average molecular weight (Mn) is defined as a value measured by gel permeation chromatography (GPC) and calculated relative to polystyrene standards. According to the present specification, the number average molecular weight (Mn) can be determined by using, for example, HLC-8220 (manufactured by Tosoh Corporation) and using a guide column HZ-L, TSKgel Super HZM-M, TSKgel Super HZ4000, TSKgel Super HZ3000, or HSKgel Super HZ2000 (all manufactured by Tosoh Corporation) as columns. Regarding the eluent, unless particularly stated otherwise, measurement is made using THF (tetrahydrofuran). Furthermore, unless particularly stated otherwise, detection is carried out using an ultraviolet (UV) 254-nm detector.

Photocurable Composition

The photocurable composition of the invention includes a monofunctional (meth)acrylate represented by the following General Formula (I) (hereinafter, may be referred to as "particular monofunctional (meth)acrylate") and a photopolymerization initiator:

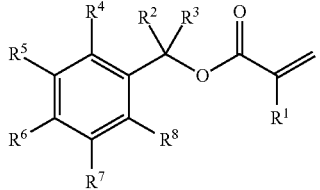

(I)

where $R^1$ represents a hydrogen atom or a methyl group,
$R^2$ represents an alkyl group which may be substituted with a fluorine atom,
$R^3$ represents a hydrogen atom, a linear alkyl group which may be substituted with a fluorine atom, or a branched alkyl group which may be substituted with a fluorine atom,
$R^4$ to $R^8$ each independently represent a hydrogen atom, a halogen atom, a linear alkyl group having 1 to 4 carbon atoms, or a branched alkyl group having 3 or 4 carbon atoms,
the total number of carbon atoms included in $R^2$ and $R^3$ is 1 to 6, and
$R^2$ and $R^3$, or $R^2$ and $R^4$ may be bonded to each other and form a ring.

By adopting such a configuration, a photocurable composition capable of suppressing both deformation (ΔLWR) of a pattern after etching and breakage of a pattern after etching is obtained.

A photocurable composition that is used for imprinting is generally required to have applicability onto a substrate (for example, inkjet jettability), imprint suitability (for example, fillability or mold releasability), and the like. As described above, in applications of performing dry etching processing, such as semiconductor applications, etching resistance is also required. Regarding the etching resistance, it is necessary that the etching rate is low under etching processing conditions, and deformation of a pattern after etching does not occur. In a case in which the etching rate of a resist pattern is high, etching selectivity between a resist pattern and a substrate to be processed cannot be sufficiently secured, and breakage occurs in the pattern after etching.

Here, conventional photocurable compositions are not necessarily satisfactory in achieving a balance between a low etching rate and suppression of deformation (ΔLWR) of a pattern after etching.

Under such circumstances, in this invention, a balance is achieved between a low Ohnishi P and a high glass transition temperature (Tg) of a cured film thus obtainable, by employing a predetermined structure for the moieties of $R^2$ and $R^3$ of General Formula (I), which is a monofunctional (meth) acrylate, and thereby, suppression of both breakage and deformation of a pattern after etching has been successfully achieved.

Hereinafter, various components of the photocurable composition of the invention will be explained.

<Monofunctional (Meth)Acrylate Represented by General Formula (I)>

The photocurable composition of the invention includes a monofunctional (meth)acrylate represented by General Formula (I):

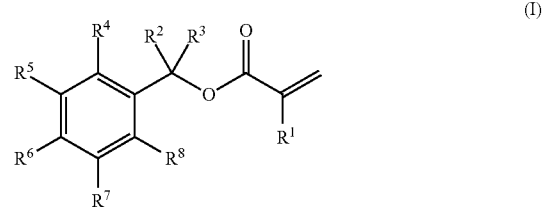

(I)

where $R^1$ represents a hydrogen atom or a methyl group,
$R^2$ represents an alkyl group which may be substituted with a fluorine atom,
$R^3$ represents a hydrogen atom, a linear alkyl group which may be substituted with a fluorine atom, or a branched alkyl group which may be substituted with a fluorine atom,
$R^4$ to $R^8$ each independently represent a hydrogen atom, a halogen atom, a linear alkyl group having 1 to 4 carbon atoms, or a branched alkyl group having 3 or 4 carbon atoms,
the total number of carbon atoms included in $R^2$ and $R^3$ is 1 to 6, and
$R^2$ and $R^3$ or $R^2$ and $R^4$ may be bonded to each other and form a ring.

In General Formula (I), $R^1$ represents a hydrogen atom or a methyl group. From the viewpoint of reactivity, $R^1$ is preferably a hydrogen atom.

In General Formula (I), $R^2$ represents an alkyl group which may be substituted with a fluorine atom.

The alkyl group may be any of a linear group, a branched group, and a cyclic group.

The number of carbon atoms of a linear alkyl group is preferably 1 to 6. The number of carbon atoms of a branched alkyl group is preferably 3 to 6. Examples of a linear or branched alkyl group include a methyl group, an ethyl group, a propyl group, an isopropyl group, a butyl group, a tert-butyl group, a pentyl group, and a hexyl group. Examples of a cyclic alkyl group include a cyclopropyl group, a cyclobutyl group, a cyclopentyl group, and a cyclohexyl group, and a cyclopropyl group, a cyclobutyl group, and a cyclopentyl group are more preferred.

It is preferable that these alkyl groups are not substituted with fluorine atoms; however, it is also acceptable that the alkyl groups are substituted with fluorine atoms. That is, a portion or all of the hydrogen atoms carried by an alkyl group may be substituted by fluorine atoms. In a case in which the alkyl group is substituted with a fluorine atom, the alkyl group may be any of a linear alkyl group, a branched alkyl group, and a cyclic alkyl group; however, a linear or branched alkyl group is preferred, and a linear alkyl group is more preferred. Furthermore, in a case in which the alkyl group is substituted with a fluorine atom, the alkyl group is preferably a perfluoroalkyl group in which all the hydrogen atoms carried by an alkyl group have been substituted by fluorine atoms. Examples of the perfluoroalkyl group include a trifluoromethyl group.

Among these, $R^2$ is preferably a methyl group or a trifluoromethyl group, and a methyl group is particularly preferred.

In General Formula (I), $R^3$ represents a hydrogen atom, a linear alkyl group which may be substituted with a fluorine atom, or a branched alkyl group which may be substituted with a fluorine atom.

The number of carbon atoms of a linear alkyl group is preferably 1 to 5. The number of carbon atoms of a branched alkyl group is preferably 3 to 5.

Examples of a linear or branched alkyl group include a methyl group, an ethyl group, a propyl group, an isopropyl group, a butyl group, a tert-butyl group, and a pentyl group. It is preferable that the linear or branched alkyl group is not substituted with a fluorine atom; however, it is also acceptable that the linear or branched alkyl group is substituted with a fluorine atom. In a case in which the alkyl group is substituted with a fluorine atom, the alkyl group may be any of a linear alkyl group and a branched alkyl group; however, a linear alkyl group is preferred. Furthermore, in a case in which the alkyl group is substituted with a fluorine atom, the alkyl group is preferably a perfluoroalkyl group. The perfluoroalkyl group is preferably a trifluoromethyl group.

Among these, $R^3$ is preferably a hydrogen atom, a methyl group, or a trifluoromethyl group, and a hydrogen atom is particularly preferred.

In regard to General Formula (I), the total number of carbon atoms included in $R^2$ and $R^3$ is 1 to 6, preferably 1 to 5, and more preferably 1 to 4. By adjusting the total number of carbon atoms to such a range, the viscosity can be further decreased, and breakage of a pattern after etching can be more effectively suppressed.

In General Formula (I), $R^4$ to $R^8$ each independently represent a hydrogen atom, a halogen atom, a linear alkyl group having 1 to 4 carbon atoms, or a branched alkyl group having 3 or 4 carbon atoms.

The halogen atom is preferably a chlorine atom or a fluorine atom, and more preferably a fluorine atom.

Examples of the linear or branched alkyl group include a methyl group, an ethyl group, a propyl group, an isopropyl group, a butyl group, and a tert-butyl group. Among these, a hydrogen atom or a methyl group is preferred.

In General Formula (I), $R^2$ and $R^3$, or $R^2$ and $R^4$ may be bonded to each other and form a ring.

The ring formed as $R^2$ and $R^4$ are bonded to each other is preferably a ring having 3 to 6 carbon atoms, and more preferably a ring having 4 to 6 carbon atoms. Specific examples of the ring formed as $R^2$ and $R^4$ are bonded to each other include a cyclobutyl group, a cyclopentyl group, and a cyclohexyl group.

In a case in which $R^2$ and $R^4$ are bonded to each other and form a ring, it is preferable that the monofunctional (meth) acrylate represented by General Formula (I) is represented by General Formula (II) that will be described below.

An example of preferred embodiments of the monofunctional (meth)acrylate represented by General Formula (I) according to the invention may be an embodiment in which $R^2$ and $R^3$ each independently represent a methyl group which may be substituted with a fluorine atom. According to the present embodiment, it is preferable that $R^5$ to $R^8$ each represent a hydrogen atom.

Another example of preferred embodiments of the monofunctional (meth)acrylate represented by General Formula (I) according to the invention may be an embodiment in which $R^4$ represents a linear alkyl group having 1 to 4 carbon atoms or a branched alkyl group having 3 or 4 carbon atoms (more preferably, $R^4$ represents a methyl group), $R^5$ to $R^7$ each represent a hydrogen atom, and $R^8$ represents a hydrogen atom or a methyl group.

Another example of preferred embodiments of the monofunctional (meth)acrylate represented by General Formula (I) according to the invention may be an embodiment in which $R^5$ to $R^8$ each represent a hydrogen atom.

Another example of preferred embodiments of the monofunctional (meth)acrylate represented by General Formula (I) may be a monofunctional (meth)acrylate represented by General Formula (II):

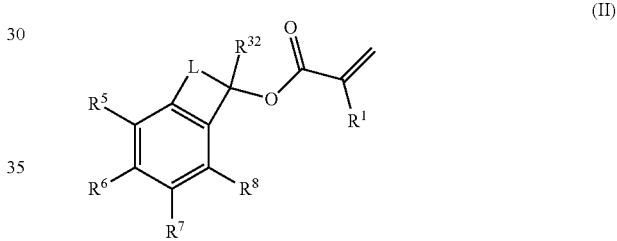

(II)

where R represents a hydrogen atom or a methyl group,

L represents a linear alkylene group or a branched alkylene group, $R^{32}$ represents a hydrogen atom, a linear alkyl group, or a branched alkyl group, $R^5$ to $R^8$ each independently represent a hydrogen atom, a halogen atom, a linear alkyl group having 1 to 4 carbon atoms, or a branched alkyl group having 3 or 4 carbon atoms, and the total number of carbon atoms included in L and $R^{32}$ is 1 to 6.

In regard to General Formula (II), a preferred range of $R^1$ is similar to that of $R^1$ in General Formula (I).

In General Formula (II), $R^{32}$ represents a hydrogen atom, a linear alkyl group, or a branched alkyl group, and a hydrogen atom is preferred. The number of carbon atoms of a linear alkyl group is preferably 1 to 5. The number of carbon atoms of a branched alkyl group is preferably 3 to 5. Examples of the linear or branched alkyl group include a methyl group, an ethyl group, a propyl group, an isopropyl group, a butyl group, a tert-butyl group, and a pentyl group.

In regard to General Formula (II), preferred ranges of $R^5$ to $R^8$ are each independently similar to those of $R^5$ to $R^8$ in General Formula (I).

In General Formula (II), L represents a linear or branched alkylene group. The number of carbon atoms of the alkylene group is 1 to 6, and preferably 1 to 4. The alkylene group is preferably a linear alkylene group.

Specific examples of the alkylene group include a methylene group, an ethylene group, a 1,3-propylene group, a 1,4-butylene group, and a 1,1-dimethylethylene group. Among these, an ethylene group is more preferred.

The molecular weight of the monofunctional (meth)acrylate represented by General Formula (I) is preferably 175 to 500, and more preferably 190 to 250.

The viscosity at 25° C. of the monofunctional (meth)acrylate represented by General Formula (I) is preferably 3 to 50 mPa·s, more preferably 4 to 20 mPa·s, and even more preferably 7 to 10 mPa·s. By adjusting the viscosity to such a range, inkjet jetting accuracy can be further increased. Regarding the method for measuring viscosity, the method described in the Examples that will be described below is employed. In a case in which the measuring instrument used in the Examples is out of manufacture or the like, another instrument having equivalent performance can be used. Hereinafter, the same also applies to other measurement methods.

The Ohnish P of the monofunctional (meth)acrylate represented by General Formula (I) is preferably 3.2 or less, more preferably 3.0 or less, even more preferably 2.9 or less, and still more preferably 2.8 or less.

The Tg of a homopolymer of the monofunctional (meth)acrylate represented by General Formula (I) is preferably 25° C. or higher, more preferably 45° C. or higher, and even more preferably 65° C. or higher. In this invention, since the Tg of the homopolymer thus obtainable can be made relatively high while maintaining the Ohnishi P of the monofunctional (meth)acrylate represented by General Formula (I) lower, a balance can be achieved between low Ohnishi P of the photocurable composition and high Tg of a cured film thus obtainable, and therefore, a photocurable composition having excellent etching resistance is obtained.

The method for measuring the Tg of a homopolymer conforms to the method defined in the Examples that will be described below.

Specific examples of the monofunctional (meth)acrylate represented by General Formula (I) include the following (meth)acrylates. It is needless to say that the invention is not intended to be limited to these.

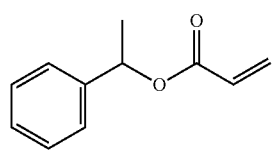

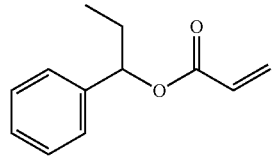

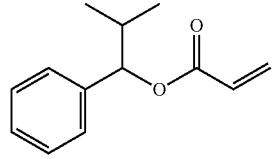

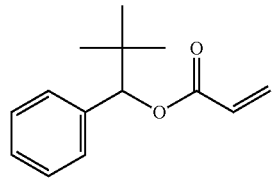

-continued

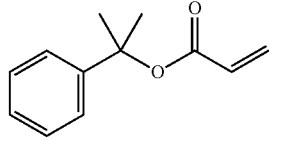

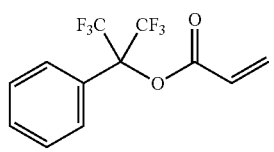

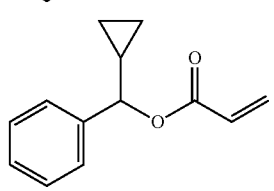

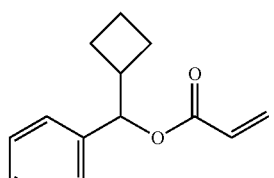

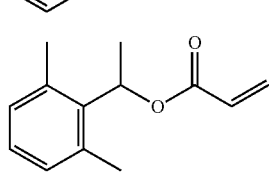

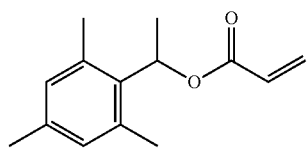

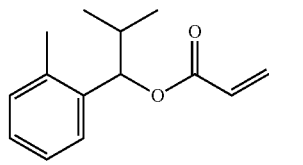

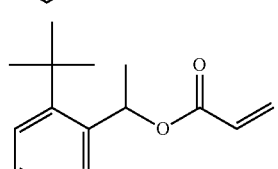

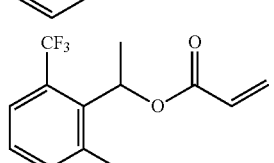

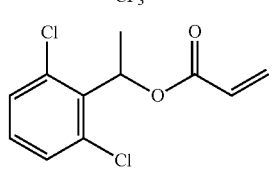

-continued

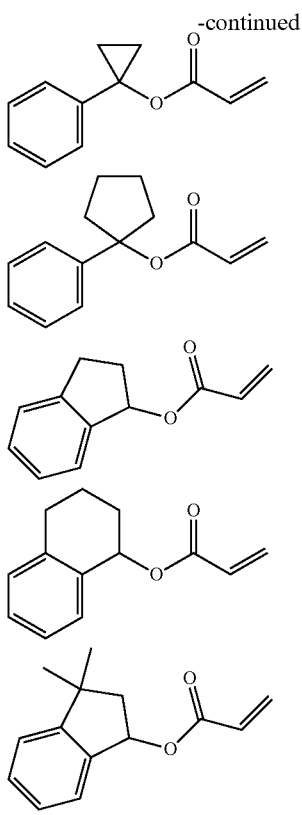

The content of the monofunctional (meth)acrylate represented by General Formula (I) in the photocurable composition of the invention is preferably 20% to 80% by mass with respect to all the components except for the solvent in the photocurable composition. The lower limit is more preferably 25% by mass or more, even more preferably 30% by mass or more, and particularly preferably 40% by mass or more. The upper limit is more preferably 75% by mass or less, even more preferably 70% by mass or less, and particularly preferably 60% by mass or less.

The photocurable composition may include only one kind of the monofunctional (meth)acrylate represented by General Formula (I), or may include two or more kinds thereof. In a case in which two or more kinds thereof are included, it is preferable that the total amount is in the above-mentioned range.

<Aliphatic Monofunctional (Meth)Acrylate>

The photocurable composition of the invention may include an aliphatic monofunctional (meth)acrylate. It is intended that regarding the aliphatic monofunctional (meth) acrylate as used herein, any compound corresponding to the fluorine-containing monofunctional (meth)acrylate that will be described below will be excluded from the aliphatic monofunctional (meth)acrylate.

The aliphatic monofunctional (meth)acrylate is preferably an ester of a linear or branched aliphatic alcohol having 9 to 16 carbon atoms and (meth)acrylic acid.

The molecular weight of the aliphatic monofunctional (meth)acrylate is preferably 195 to 315, more preferably 210 to 285, and even more preferably 225 to 270.

Specific examples of the aliphatic monofunctional (meth) acrylate include n-nonyl (meth)acrylate, i-nonyl (meth)acrylate, n-decyl (meth)acrylate, i-decyl (meth)acrylate, 2-propylheptyl (meth)acrylate, n-undecyl (meth)acrylate, n-dodecyl (meth)acrylate, 2-butyloctyl (meth)acrylate, n-tridecyl (meth)acrylate, n-tetradecyl (meth)acrylate, and n-hexadecyl (meth)acrylate. Among these, n-decyl acrylate, 2-propylheptyl acrylate, n-undecyl acrylate, n-dodecyl acrylate, 2-butyloctyl acrylate, n-tridecyl acrylate, and n-tetradecyl acrylate are preferred; n-undecyl acrylate, n-dodecyl acrylate, 2-butyloctyl acrylate, n-tridecyl acrylate, and n-tetradecyl acrylate are more preferred; and n-dodecyl acrylate, n-tridecyl acrylate, or n-tetradecyl acrylate is particularly preferred.

In a case in which the photocurable composition of the invention includes an aliphatic monofunctional (meth)acrylate, the content thereof is preferably 5% to 30% by mass, more preferably 10% to 25% by mass, and even more preferably 15% to 20% by mass, with respect to all the components except for the solvent in the photocurable composition.

The photocurable composition of the invention may be configured such that the composition substantially does not include the aliphatic monofunctional (meth)acrylate. The phrase "substantially does not include" means that the content is, for example, 5% by mass or less, 3% by mass or less, or particularly 1% by mass or less, of all the polymerizable compounds included in the photocurable composition of the invention.

The photocurable composition of the invention may include only one kind of the aliphatic monofunctional (meth)acrylate, or may include two or more kinds thereof. In a case in which the composition includes two or more kinds, it is preferable that the total amount is in the range described above.

<Fluorine-Containing Monofunctional (Meth)Acrylate>

The photocurable composition of the invention may further include a monofunctional (meth)acrylate containing a fluorine atom. However, it should be noted that the monofunctional (meth)acrylate containing a fluorine atom that is explained herein does not include the compound represented by General Formula (I).

The molecular weight of the fluorine-containing monofunctional (meth)acrylate is preferably 300 to 600, more preferably 350 to 550, and even more preferably 400 to 500.

It is preferable that the fluorine-containing monofunctional (meth)acrylate is a fluorine-containing (meth)acrylate represented by the following General Formula (IV):

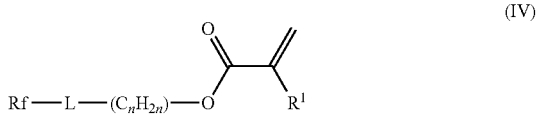

(IV)

where $R^1$ represents a hydrogen atom or a methyl group; Rf represents a fluorine-containing alkyl group having 1 to 9 carbon atoms, the alkyl group having at least one of the hydrogen atoms substituted by a fluorine atom; L represents a single bond, —O—, —OC(=O)—, or —C(=O)O—; and n represents an integer from 0 to 8.

In General Formula (IV), $R^1$ represents a hydrogen atom or a methyl group. From the viewpoint of reactivity, $R^1$ is preferably a hydrogen atom.

In General Formula (IV), Rf represents a fluorine-containing alkyl group having 1 to 9 carbon atoms, the alkyl group having at least one of the hydrogen atoms substituted by a fluorine atom. Rf may be any of a linear group, a branched group, and a cyclic group; however, a linear or branched group is preferred, and a linear group is more preferred. According to the present specification, the "fluorine-containing alkyl group having 1 to 9 carbon atoms, the alkyl group having at least one of the hydrogen atoms substituted by a fluorine atom" means an alkyl group having 1 to 9 carbon atoms and containing a fluorine atom as a substituent, and this is not intended to be limited to a group synthesized by substituting the hydrogen atoms of an alkyl group with fluorine atoms.

The number of carbon atoms of Rf is preferably 2 to 9, more preferably 4 to 9, even more preferably 5 to 8, and particularly preferably 6 to 8.

The substitution ratio of fluorine atoms in Rf is preferably 40% to 100%, more preferably 50% to 90%, and even more preferably 65% to 85%. As this embodiment is employed, mold releasability can be enhanced. The substitution ratio of fluorine atoms means the ratio (%) of the number of hydrogen atoms substituted by fluorine atoms with respect to the number of all the hydrogen atoms included in an alkyl group having 1 to 9 carbon atoms.

Rf is preferably a fluorine-containing alkyl group composed of a perfluoroalkyl group having 4 to 6 carbon atoms and an alkylene group having 1 to 3 carbon atoms, or a fluorine-containing alkyl group composed of a ω-H-perfluoroalkyl group having 4 to 6 carbon atoms and an alkylene group having 1 to 3 carbon atoms, and more preferably a fluorine-containing alkyl group composed of a perfluoroalkyl group having 4 to 6 carbon atoms and an alkylene group having 1 to 3 carbon atoms.

Specific examples of Rf include $CF_3CH_2—$, $CF_3CF_2CH_2—$, $CF_3(CF_2)_2CH_2—$, $CF_3(CF_2)_3CH_2CH_2—$, $CF_3(CF_2)_4CH_2CH_2CH_2—$, $CF_3(CF_2)_4CH_2—$, $CF_3(CF_2)_5CH_2CH_2—$, $CF_3(CF_2)_5CH_2CH_2CH_2—$, $(CF_3)_2CH—$, $(CF_3)_2C(CH_3)CH_2—$, $(CF_3)_2CF(CF_2)_2CH_2CH_2—$, $(CF_3)_2CF(CF_2)_4CH_2CH_2—$, $H(CF_2)_2CH_2—$, $H(CF_2)_4CH_2—$, $H(CF_2)_6CH_2—$, and $H(CF_2)_8CH_2—$. Among these, $CF_3(CF_2)_4CH_2—$, $CF_3(CF_2)_5CH_2—$, $CF_3(CF_2)_5CH_2CH_2—$, $CF_3(CF_2)_5CH_2CH_2CH_2—$, and $H(CF_2)_6CH_2—$ are preferred; $CF_3(CF_2)_5CH_2CH_2—$ or $CF_3(CF_2)_5CH_2CH_2CH_2—$ is more preferred; and $CF_3(CF_2)_5CH_2CH_2—$ is particularly preferred.

In General Formula (IV), L represents a single bond, —O—, —OC(=O)—, or —C(=O)O—, and a single bond or —O— is preferred.

In a case in which L represents —O—, —OC(=O)—, or —C(=O)O—, n is preferably 1 to 5, and more preferably 1 to 3.

In a case in which L represents a single bond, n is preferably 0 to 6, more preferably 0 to 4, and even more preferably 0.

Specific preferred examples of the fluorine-containing monofunctional (meth)acrylate include the following compounds; however, the examples are not limited to these compounds. $R^1$ represents a hydrogen atom or a methyl group, and a hydrogen atom is preferred.

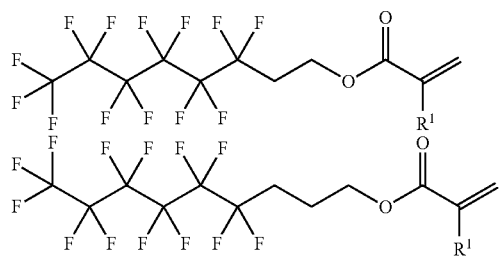

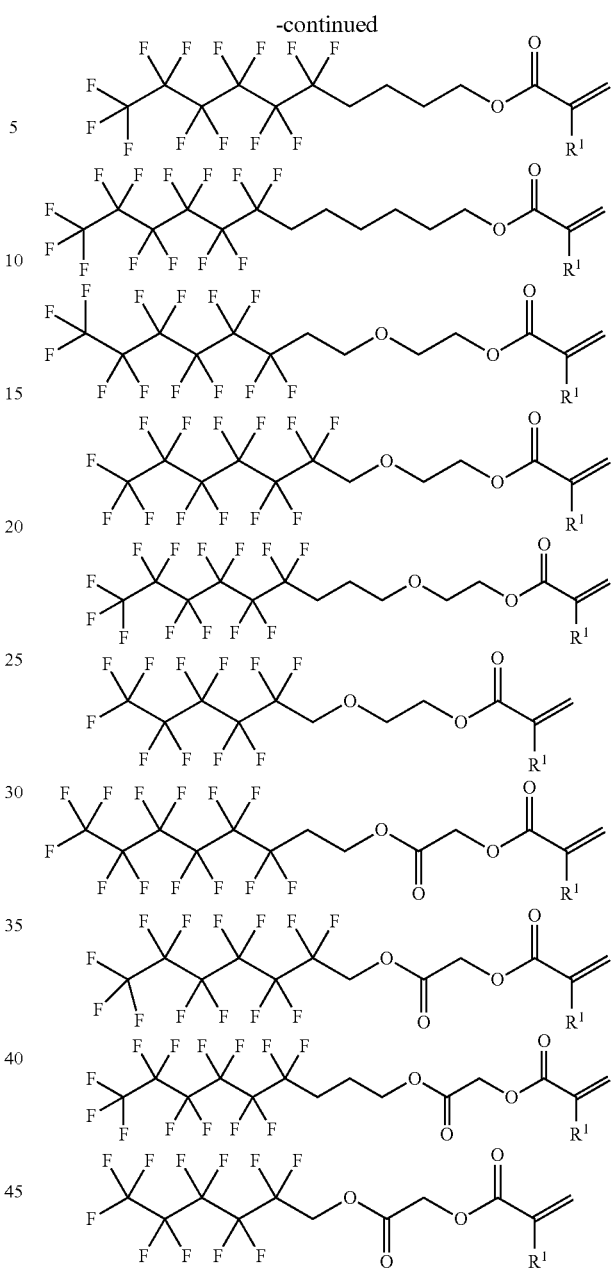

As a commercially available product, trade name FAAC-6 manufactured by Unimatec Corporation can also be used.

In a case in which the photocurable composition of the invention includes a fluorine-containing monofunctional (meth)acrylate, the content of the compound is preferably 1% to 5% by mass, and more preferably 1% to 3% by mass, with respect to all the components except for the solvent in the photocurable composition. In a case in which the content of the fluorine-containing monofunctional (meth)acrylate is set to 1% by mass or more, mold releasability is further enhanced. In a case in which the content of the fluorine-containing monofunctional (meth)acrylate is set to 5% by mass or less, excellent pattern roughness is obtained. The fluorine-containing monofunctional (meth)acrylates may be used singly or in combination of two or more kinds thereof. In the case of using two or more kinds, it is preferable that the total amount of the compounds is in the range described above.

<Other Monofunctional (Meth)Acrylates>

The photocurable composition of the invention may also include monofunctional (meth)acrylates other than the monofunctional (meth)acrylate represented by General Formula (I), the aliphatic monofunctional (meth)acrylate, and the fluorine-containing monofunctional (meth)acrylate (referred to as other monofunctional (meth)acrylates).

Examples of the other monofunctional (meth)acrylates include a monofunctional (meth)acrylate having an aromatic group other than the monofunctional (meth)acrylate represented by General Formula (I), a monofunctional (meth)acrylate having an alicyclic hydrocarbon group, and a monofunctional (meth)acrylate having a hydroxyl group or an ether group.

Specific examples of the other monofunctional (meth)acrylate include benzyl (meth)acrylate, phenethyl (meth)acrylate, 2-phenoxyethyl (meth)acrylate, benzyl (meth)acrylate having a substituent on the aromatic ring (preferred examples of the substituent include an alkyl group having 1 to 6 carbon atoms, an alkoxy group having 1 to 6 carbon atoms, and a cyano group), 1- or 2-naphthyl (meth)acrylate, 1- or 2-naphthylmethyl (meth)acrylate, 1- or 2-naphthylethyl (meth)acrylate, isobornyl (meth)acrylate, dicyclopentanyl (meth)acrylate, dicyclopentanyloxyethyl (meth)acrylate, 1-adamantyl (meth)acrylate, 2-adamantyl (meth)acrylate, 2-methyl-2-adamantyl (meth)acrylate, hydroxyethyl (meth)acrylate, 2-hydroxypropyl (meth)acrylate, 4-hydroxybutyl (meth)acrylate, methoxyethyl (meth)acrylate, ethoxyethoxyethyl (meth)acrylate, tetrahydrofurfuryl (meth)acrylate, (2-methyl-2-ethyl-1,3-dioxolan-4-yl) methyl (meth)acrylate, and (3-ethyloxetan-3-yl)methyl (meth)acrylate.

In a case in which the photocurable composition of the invention includes any of the other monofunctional (meth)acrylates, the content of the compound is preferably 5% to 40% by mass, and more preferably 10% to 30% by mass, with respect to all the components except for the solvent in the photocurable composition.

The photocurable composition may include the other monofunctional (meth)acrylates singly or in combination of two or more kinds thereof. In a case in which the composition includes two or more kinds thereof, it is preferable that the total amount of the compounds is in the range described above.

The photocurable composition of the invention can also be configured such that the composition substantially does not include the other monofunctional (meth)acrylates. The phrase "substantially does not include" means that the content is, for example, 5% by mass or less, 3% by mass or less, or particularly 1% by mass or less, of all the polymerizable compounds included in the photocurable composition of the invention.

<Polyfunctional (Meth)Acrylate>

It is preferable that the photocurable composition of the invention includes a polyfunctional (meth)acrylate of bifunctionality or higher functionality.

The polyfunctional (meth)acrylate is preferably an ester between an aromatic polyhydric alcohol or an aliphatic polyhydric alcohol and (meth)acrylic acid.

It is preferable that the polyfunctional (meth)acrylate has 2 to 6 (meth)acrylate groups, more preferably 2 or 3 (meth)acrylate groups, and particularly preferably 2 (meth)acrylate groups.

The molecular weight of the polyfunctional (meth)acrylate is preferably 170 to 600, more preferably 190 to 300, and even more preferably 210 to 270. In a case in which the molecular weight is in the above-mentioned range, a balance between the suppression of volatility and low viscosity can be achieved.

The polyfunctional (meth)acrylate is preferably a polyfunctional (meth)acrylate having an aromatic group, a polyfunctional (meth)acrylate having an alicyclic hydrocarbon group, or a chain-like aliphatic polyfunctional (meth)acrylate having neither an aromatic group nor an alicyclic hydrocarbon group. The polyfunctional (meth)acrylate is more preferably a polyfunctional (meth)acrylate having an aromatic group or a polyfunctional (meth)acrylate having an alicyclic hydrocarbon group, and even more preferably a polyfunctional (meth)acrylate having an aromatic group.

It is preferable that the polyfunctional (meth)acrylate that can be used for the invention is more specifically represented by the formula: P-O-L-R-L-O-P. Here, P represents a (meth)acryloyl group; L represents a single bond or a linking group; and R represents an aromatic group, an alicyclic hydrocarbon group, or a linear or branched hydrocarbon group. L is preferably a single bond or an alkylene group; more preferably a single bond, a methylene group, or an ethylene group; and even more preferably a methylene group. R is preferably a phenylene group, a cyclohexane group, or a linear or branched hydrocarbon group having 2 to 6 carbon atoms.

Specific examples of the polyfunctional (meth)acrylate having an aromatic group include o-, m-, or p-phenylene di(meth)acrylate, o-, m-, or p-xylylene di(meth)acrylate, bisphenol A di(meth)acrylate, ethyleneoxy (EO)-modified bisphenol A di(meth)acrylate, propyleneoxy (PO)-modified bisphenol A di(meth)acrylate, EO-modified bisphenol F di(meth)acrylate, and 9,9-bis[4-(2-(meth)acryloyloxyethoxy)phenyl]fluorine. Among these, m-xylylene diacrylate is particularly suitably used for the invention.

Specific examples of the polyfunctional (meth)acrylate having an alicyclic hydrocarbon group include trans-1,2-cyclohexanediol di(meth)acrylate, cis-1,2-cyclohexanediol di(meth)acrylate, 1,3-cyclohexanediol di(meth)acrylate, 1,4-cyclohexanediol di(meth)acrylate, 1,2-cyclohexanedimethanol di(meth)acrylate, 1,3-cyclohexanedimethanol di(meth)acrylate, 1,4-cyclohexanedimethanol di(meth)acrylate, norbornanedimethanol di(meth)acrylate, tricyclodecanedimethanol di(meth)acrylate, and 1,3-adamantanediol di(meth)acrylate. Among these, 1,2-cyclohexanediol di(meth)acrylate, 1,4-cyclohexanedimethanol diacrylate, and tricyclodecanedimethanol diacrylate are suitably used for the invention.

Specific examples of the chain-like aliphatic polyfunctional (meth)acrylate having neither an aromatic group nor an alicyclic hydrocarbon group include ethylene glycol di(meth)acrylate, 1,3-butanediol di(meth)acrylate, 1,4-butanediol di(meth)acrylate, cis-2-butene-1,4-diol diacrylate, neopentyl glycol di(meth)acrylate, 1,6-hexanediol di(meth)acrylate, 3-methyl-1,5-pentanediol di(meth)acrylate, 1,9-nonanediol di(meth)acrylate, 2-butyl-2-ethyl-1,3-propanediol di(meth)acrylate, 1,10-decanediol di(meth)acrylate, diethylene glycol di(meth)acrylate, triethylene glycol di(meth)acrylate, tetraethylene glycol di(meth)acrylate, polyethylene glycol di(meth)acrylate, dipropylene glycol di(meth)acrylate, tripropylene glycol di(meth)acrylate, polypropylene glycol di(meth)acrylate, polytetramethylene glycol di(meth)acrylate, EO-modified neopentyl glycol di(meth)acrylate, PO-modified neopentyl glycol di(meth)acrylate, 2,2-dimethyl-3-((meth)acryloyloxy)propyl 2,2-dimethyl-3-((meth)acryloyloxy)propionate, 2-hydroxy-3-acryloyloxypropyl methacrylate, trimethylolpropane tri (meth)acrylate, ditrimethylolpropane tetra(meth)acrylate, pentaerythritol tri(meth)acrylate, pentaerythritol tetra(meth)acrylate, dipentaerythritol hexa(meth)acrylate, and tris(2-(meth)acryloyloxyethyl) isocyanurate.

Among these, 1,3-butanediol diacrylate, 1,4-butanediol diacrylate, cis-2-butene-1,4-diol diacrylate, neopentyl glycol diacrylate, 1,6-hexanediol diacrylate, and 3-methyl-1,5-pentanediol diacrylate are particularly suitably used for the invention.

Examples of commercially available products include trade name LIGHT ACRYLATE NP-A manufactured by Kyoeisha Chemical Co., Ltd.; and VISCOAT #195 and VISCOAT #230 manufactured by Osaka Organic Chemical Industry, Ltd.

It is preferable that the photocurable composition includes the polyfunctional (meth)acrylate at a proportion of 20% to 79% by mass with respect to all the components except for the solvent in the photocurable composition. The lower limit is more preferably 25% by mass or more, even more preferably 30% by mass or more, and particularly preferably 40% by mass. The upper limit is more preferably 75% by mass or less, even more preferably 70% by mass or less, and particularly preferably 60% by mass or less. In a case in which the content of the polyfunctional (meth)acrylate is in the above-mentioned range, a pattern having excellent film hardness is obtained.

The polyfunctional (meth)acrylates may be used singly or in combination of two or more kinds thereof. In the case of using two or more kinds, it is preferable that the total amount of the compounds is in the above-mentioned range.

Particularly, it is preferable that the photocurable composition includes the polyfunctional (meth)acrylate having an aromatic group and the polyfunctional (meth)acrylate having an alicyclic hydrocarbon group at a total proportion of 20% to 80% by mass with respect to all the components except for the solvent in the photocurable composition.

The mass ratio between the monofunctional (meth)acrylate and the polyfunctional (meth)acrylate is preferably 20:80 to 80:20, more preferably 30:70 to 70:30, and even more preferably 40:60 to 60:40. By setting the mass ratio to a value in such a range, inkjet jetting accuracy, mold fillability, curability, mold releasability, strength of the cured film, and etching resistance can be enhanced.

<Photopolymerization Initiator>

The photocurable composition of the invention includes a photopolymerization initiator. Regarding the photopolymerization initiator, any agent can be used as long as the agent is a compound capable of generating an active species that polymerizes a polymerizable compound as a result of light irradiation. Regarding the photopolymerization initiator, a photoradical polymerization initiator or a photocationic polymerization initiator is preferred, and a photoradical polymerization initiator is more preferred.

Regarding the photoradical polymerization initiator, for example, a commercially available initiator can be used. Examples thereof include, for example, the initiators described in paragraph 0091 of JP2008-105414A can be preferably employed. Among these, an acetophenone-based compound, an acylphosphine oxide-based compound, and an oxime ester-based compound are preferred from the viewpoints of curing sensitivity and absorption characteristics. Commercially available products include IRGACURE (registered trademark) 1173, IRGACURE 184, IRGACURE 2959, IRGACURE 127, IRGACURE 907, IRGACURE 369, IRGACURE 379, LUCIRIN (registered trademark) TPO, IRGACURE 819, IRGACURE OXE-01, IRGACURE OXE-02, IRGACURE 651, and IRGACURE 754 (all manufactured by BASF SE).

The photopolymerization initiators may be used singly; however, it is also preferable to use two or more kinds thereof in combination. In the case of using two or more kinds in combination, it is more preferable that two or more kinds of photoradical polymerization initiators are used in combination. Specifically, examples of the combination include combinations of IRGACURE 1173 with IRGACURE 907, IRGACURE 1173 with LUCIRIN TPO, IRGACURE 1173 with IRGACURE 819, IRGACURE 1173 with IRGACURE OXE-01, IRGACURE 907 with LUCIRIN TPO, and IRGACURE 907 with IRGACURE 819. By employing such a combination, the exposure margin can be extended.

The ratio (mass ratio) in the case of using two kinds of photopolymerization initiators in combination is preferably 9:1 to 1:9, more preferably 8:2 to 2:8, and even more preferably 7:3 to 3:7.

The content of the photopolymerization initiator is preferably 0.1% to 15% by mass, more preferably 0.5% to 10% by mass, and even more preferably 1% to 5% by mass, with respect to all the components except for the solvent in the photocurable composition. The photocurable composition may include only one kind of the photopolymerization initiator, or may include two or more kinds of photopolymerization initiators. In a case in which the photocurable composition includes two or more kinds, it is preferable that the total amount of the compounds is in the above-mentioned range. In a case in which the content of the photopolymerization initiator is set to 0.1% by mass or more, sensitivity (rapid curability), resolution characteristics, line edge roughness characteristics, and film hardness tend to be further enhanced, which is preferable. In a case in which the content of the photopolymerization initiator is set to 15% by mass or less, light transmittance, colorability, handleability and the like tend to be enhanced, which is preferable.

<Non-Polymerizable Compound Having Polyoxyalkylene Structure>

The photocurable composition of the invention may include a non-polymerizable compound having a polyoxyalkylene structure, in order to obtain more satisfactory mold releasability. Here, the term "non-polymerizable compound" means a compound that does not have a polymerizable group.

The polyoxyalkylene structure is preferably a polyoxyethylene structure, a polyoxypropylene structure, a polyoxybutylene structure, or a mixed structure thereof; more preferably a polyoxyethylene structure or a polyoxypropylene structure; and particularly preferably a polyoxypropylene structure. Furthermore, a structure branching from a polyhydric alcohol such as glycerin or pentaerythritol as a core is also preferable.

Regarding the polyoxyalkylene structure, a structure having 3 to 30 polyoxyalkylene constitutional units is preferred, a structure having 5 to 20 polyoxyalkylene constitutional units is more preferred, a structure having 7 to 15 polyoxyalkylene constitutional units is even more preferred, and a structure having 9 to 13 polyoxyalkylene constitutional units is particularly preferred.

The terminal hydroxyl groups of the polyoxyalkylene structure may not be substituted, at least one of the terminal hydroxyl groups may be substituted by an organic group, or all of them may be substituted by organic groups. The organic group is preferably an organic group having 1 to 20 carbon atoms and may have an oxygen atom, a fluorine atom, or a silicon atom; however, it is preferable that the organic group does not have a fluorine atom or a silicon atom. It is preferable that the organic group is linked to the polyoxyalkylene structure via an ether bond, an ester bond, or a divalent linking group. Specific examples of the organic group include hydrocarbon groups such as a methyl group, an ethyl group, a butyl group, an octyl group, a benzyl group, and a phenyl group; a fluorine-containing alkyl group, a fluorine-containing alkyl ether group, and a polysiloxane group.

The number average molecular weight of the non-polymerizable compound is preferably 300 to 3,000, more preferably 400 to 2,000, and even more preferably 500 to 1,500.

Specific examples of the non-polymerizable compound include polyoxyethylene (also called polyethylene glycol), polyoxypropylene (also called polypropylene glycol), polyoxybutylene, polyoxyethylene-polyoxypropylene (block and random), polyoxyethylene (hereinafter, abbreviated to PEG) glyceryl ether, polyoxypropylene (hereinafter, abbreviated to PPG) glyceryl ether, PEG-PPG glyceryl ether, PEG bisphenol A ether, PEG trimethylolpropane ether, PEG pentaerythritol ether, PEG neopentyl glycol ether, PEG trimethylolpropane ether, PEG methyl ether, PEG butyl ether, PEG 2-ethylhexyl ether, PEG lauryl ether, PEG oleyl ether, PPG methyl ether, PPG butyl ether, PPG lauryl ether, PPG oleyl ether, PEG phenyl ether, PEG octyl phenyl ether, PEG nonyl phenyl ether, PEG naphthyl ether, PEG styrenated phenyl ether, PPG phenyl ether, PPG octyl phenyl ether, PPG nonyl phenyl ether, PEG dimethyl ether, PEG dibenzyl ether, PPG dimethyl ether, PPG dibenzyl ether, PEG-PPG dimethyl ether, PEG glyceryl ether trimethyl ether, PPG glyceryl ether trimethyl ether, PEG monoacetate, PEG monolaurate, PEG monooleate, PPG monoacetate, PPG monolaurate, PPG monooleate, PEG diacetate, PEG dilaurate, PEG dioleate, PPG diacetate, PPG dilaurate, PPG dioleate, PEG glycerin fatty acid ester, PEG sorbitan fatty acid ester, PEG sorbitol fatty acid ester, and ethylene oxide adducts such as 2,4,7,9-tetramethyl-5-decyne-4,7-diol (for example, OLFINE E1004, E1010, E1020 and the like manufactured by Nissin Chemical Industry Co., Ltd.; and SURFINOL 420, 440, 465, 485, 2502, 2505 and the like manufactured by Air Products and Chemicals, Inc.).

In regard to the non-polymerizable compound, the description of paragraphs 0105 and 0106 of JP2013-036027A can be referred to, the disclosure of which is incorporated herein by reference.

In a case in which the photocurable composition of the invention includes a non-polymerizable compound, the content is preferably 1% to 10% by mass with respect to all the components except for the solvent in the photocurable composition. The lower limit is more preferably 2% by mass or more. The upper limit is more preferably 8% by mass or less, even more preferably 6% by mass or less, and particularly preferably 4% by mass or less. The photocurable composition may include only one kind of non-polymerizable compound, or may include two or more kinds thereof. In a case in which the composition includes two or more kinds, it is preferable that the total amount of the compounds is in the above-mentioned range.

<Polymerization Inhibitor>

It is preferable that the photocurable composition of the invention includes a polymerization inhibitor. In a case in which the photocurable composition includes a polymerization inhibitor, the content is preferably 0.001% to 0.1% by mass, more preferably 0.005% to 0.08% by mass, and even more preferably 0.01% to 0.05% by mass, with respect to all the components except for the solvent in the photocurable composition. The photocurable composition may include only one kind of polymerization inhibitor, or may include two or more kinds thereof. In a case in which the photocurable composition includes two or more kinds, it is preferable that the total amount of the compounds is in the above-mentioned range. By incorporating an appropriate amount of a polymerization inhibitor, viscosity change over time can be suppressed while high curing sensitivity is maintained. The polymerization inhibitor may be added at the time of mixing all the polymerizable compounds, or may be added to the photocurable composition of the invention afterward. Specific examples of the polymerization inhibitor include 4-hydroxy-2,2,6,6-tetramethylpiperidine-1-oxyl free radical. Other specific examples of the polymerization inhibitor include the agents described in paragraph 0121 of JP2012-169462A, the disclosure of which is incorporated herein by reference.

<Surfactant>

The photocurable composition of the invention may include a surfactant, if necessary. Generally, a surfactant is a substance which has a hydrophobic portion and a hydrophilic portion in the molecule and can noticeably change the properties of an interface when added in a small amount. The surfactant according to the invention is a substance which has a hydrophobic portion and a hydrophilic portion in the molecule and noticeably lowers the surface tension of the photocurable composition when added in a small amount, and is a substance which, for example, decreases the surface tension of the photocurable composition to a value of 40 mN/m to 30 mN/m or lower, with an amount of addition of 1% by mass or less with respect to the photocurable composition. In a case in which a surfactant is incorporated into the photocurable composition of the invention, an effect of enhancing the uniformity of coating or an effect of enhancing mold releasability can be expected.

The surfactant is preferably a nonionic surfactant, and it is preferable that at least one of a fluorine-based surfactant, a Si-based surfactant, and a fluorine-Si-based surfactant is included. A fluorine-based nonionic surfactant is particularly preferred. Here, the term "fluorine-Si-based surfactant" means that the surfactant has the elements of both a fluorine-based surfactant and a Si-based surfactant.

Commercially available products of the fluorine-based nonionic surfactant include FLUORAD FC-4430 and FC-4431 manufactured by Sumitomo 3M, Ltd.; SURFLON S-241, S-242, and S-243 manufactured by Asahi Glass Co., Ltd.; EFTOP EF-PN31M-03, EF-PN31M-04, EF-PN31M-05, EF-PN31M-06, and MF-100 manufactured by Mitsubishi Materials Electronic Chemicals Co., Ltd.; POLYFOX PF-636, PF-6320, PF-656, and PF-6520 manufactured by Omnova Solutions, Inc.; FTERGENT 250, 251, 222F, and 212M DFX-18 manufactured by Neos Co., Ltd.; UNIDYNE DS-401, DS-403, DS-406, DS-451, and DSN-403N manufactured by Daikin Industries, Ltd.; MEGAFAC F-430, F-444, F-477, F-553, F-556, F-557, F-559, F-562, F-565, F-567, F-569, and R-40 manufactured by DIC Corporation; and CAPSTONE FS-3100 and ZONYL FSO-100 manufactured by DuPont Company.

In a case in which the photocurable composition of the invention includes a surfactant, the content of the surfactant is, for example, preferably 0.01% to 5% by mass, more preferably 0.1% to 4% by mass, and even more preferably 1% to 3% by mass, with respect to all the components except for the solvent in the photocurable composition. The surfactants may be used singly, or two or more kinds thereof may be used in combination. In the case of using two or more kinds of surfactants, the total amount should be in the above-mentioned range.

According to the invention, even in an embodiment that substantially does not include a surfactant, low mold release force can be achieved. Regarding the phrase "substantially does not include", for example, the content is preferably 0.001% by mass or less, and more preferably 0.0001% by mass or less, with respect to the total mass of the photocurable composition of the invention.

<Other Components>

The photocurable composition of the invention may also include, if necessary, a photosensitizer, an antioxidant, an ultraviolet absorber, a photostabilizer, an aging inhibitor, a plasticizer, an adhesion promoting agent, a thermal polymerization initiator, a photobase generator, a colorant, inorganic particles, elastomer particles, a basic compound, a photoacid generator, a photoacid proliferating agent, a chain transfer agent, an antistatic agent, a flow regulating agent, an antifoaming agent, a dispersant and the like, in addition to the components mentioned above. Specific examples of these components include the agents described in paragraphs 0092 to 0093 and paragraphs 0113 to 0137 of JP2008-105414A, the disclosure of which is incorporated herein by reference. Reference can also be made to the descriptions corresponding to WO2011/126101A, WO2013/051735A, JP2012-041521A, and JP2013-093552A, the disclosures of which are incorporated herein by reference.

According to the invention, an embodiment that substantially does not include a polymer (preferably, a non-polymerizable polymer having a weight-average molecular weight of more than 1,000, more preferably a weight-average molecular weight of more than 2,000, and even more preferably a weight-average molecular weight of 10,000 or more) can also be employed. Regarding the phrase "substantially does not include a polymer", for example, the content of the polymer is 5% by mass or less with respect to all the components except for the solvent in the photocurable composition of the invention, and the content can be adjusted to 3% by mass or less, or 1% by mass or less.

<Solvent>

The photocurable composition of the invention may include a solvent. The content of the solvent in the photocurable composition of the invention is preferably 5% by mass or less, and more preferably 3% by mass or less, and it is particularly preferable that the photocurable composition substantially does not include a solvent. Here, the phrase "substantially does not include a solvent" means that, for example, the content is 1% by mass or less with respect to the total mass of the photocurable composition of the invention. In a case in which the photocurable composition of the invention is applied on a substrate by an inkjet method, in a case where the amount of incorporation of the solvent is small, any viscosity change of the composition resulting from volatilization of the solvent can be suppressed, which is preferable. The photocurable composition may include only one kind of solvent, or may include two or more kinds of solvents. In a case in which the photocurable composition includes two or more kinds, it is preferable that the total amount of the compounds is in the range described above.

It is not necessarily essential that the photocurable composition of the invention includes a solvent; however, a solvent may be optionally added at the time of finely adjusting the viscosity of the composition, or the like. The type of the solvent that can be preferably used in the photocurable composition of the invention may be any solvent that is generally used in photocurable compositions for imprint or photoresists and is capable of dissolving and uniformly dispersing the compounds used in the invention, and the solvent is not particularly limited as long as the solvent does not react with these components. Examples of the solvent that can be used for the invention include the solvents described in paragraph 0088 of JP2008-105414A, the disclosure of which is incorporated herein by reference.

<Characteristics of Photocurable Composition>

The photocurable composition of the invention is such that the Ohnishi P is preferably 3.6 or lower, and more preferably 3.3 or lower. According to this embodiment, a cured film that does not easily undergo breakage or the like even after etching is likely to be formed. The lower limit of the Ohnishi P is not particularly limited; however, for example, a value of 2.5 or higher, or a value of 2.8 or higher, is still sufficiently practical for use.

The glass transition temperature (Tg) of the cured film of the photocurable composition of the invention is preferably 85° C. or higher, and more preferably 105° C. or higher. According to this embodiment, a cured film that does not easily undergo deformation in the line width roughness after etching is likely to be formed. The upper limit of the Tg is not particularly limited; however, for example, the upper limit can be set to a temperature of 170° C. or lower, or 160° C. or lower.

The glass transition temperature of the cured film according to the invention is a value measured by the following method.

A photocurable composition is interposed between quartz plates and is cured with ultraviolet radiation using a high-pressure mercury lamp as a light source under the conditions of a wavelength of 300 to 400 nm, an illuminance of 10 mW/cm$^2$, and an exposure time of 100 seconds. Thus, a cured film as a short strip sample having a film thickness of 150 μm and a width of 5 mm is produced. The dynamic viscoelasticity of the short strip sample is measured in the tensile sinusoidal mode using a dynamic viscoelasticity analyzer under the conditions of a distance between chucks of 20 mm, a temperature range of 20° C. to 220° C., a rate of temperature increase of 5° C./min, and a frequency of 1 Hz, and the temperature at the maximum value of a loss tangent curve thus obtained is designated as the glass transition temperature.

In regard to the photocurable composition of the invention, it is preferable that the viscosity at 23° C. is 5.5 to 15.0 mPa·s. The lower limit is, for example, more preferably 6.0 mPa·s or higher, even more preferably 6.5 mPa·s or higher, and still more preferably 7.0 mPa·s or higher. The upper limit is, for example, more preferably 12.5 mPa·s or lower, even more preferably 11.8 mPa·s or lower, still more preferably 10.5 mPa·s or lower, even more preferably 9.0 mPa·s or lower, and still more preferably 8.5 mPa·s or lower. In a case in which the viscosity is adjusted to such a range, inkjet jetting accuracy or fillability in the concavo-convex pattern of the mold can be enhanced. The value of the viscosity according to the invention is a value measured by the method described in the Examples that will be described below.

In regard to the photocurable composition of the invention, it is preferable that the surface tension at 23° C. is 27 to 33 mN/m. The lower limit is, for example, more preferably 28 mN/m or higher, and even more preferably 29 mN/m or higher. The upper limit is, for example, more preferably 32 mN/m or lower, and even more preferably 31 mN/m or lower. In a case in which the surface tension is adjusted to such a range, inkjet jetting accuracy or mold releasability can be enhanced. The value of the surface tension according to the invention is a value measured by the method described in the Examples that will be described below.

<Method for Preparing Photocurable Composition>

The photocurable composition of the invention can be prepared by mixing the various components described above. Mixing of the various components is usually carried out at a temperature in the range of 0° C. to 100° C. After the various components are mixed, for example, it is preferable that the mixture is filtered through a filter. Filtration may be carried out in multiple stages and may also be repeated several times. Furthermore, the liquid that has been filtered can also be re-filtered.

Regarding the filter, any filter that has been hitherto used for filtration applications and the like can be used without any particular limitations. Examples include filters produced from materials including a fluororesin such as polytetrafluoroethylene (PTFE); a polyamide-based resin such as nylon-6 or nylon-6,6; and a polyolefin resin (including a high-density, ultrahigh molecular weight polyolefin resin) such as polyethylene or polypropylene (PP). Among these materials, polypropylene (including high-density polypropylene) and nylon are preferred.

Regarding the pore size of the filter, for example, a pore size of about 0.003 to 5.0 μm is suitable. In a case in which the pore size is adjusted to be in this range, fine foreign materials such as the impurities or aggregates included in the composition can be reliably eliminated while the filter clogging is suppressed.

In a case in which a filter is used, another filter may be used in combination. At that time, filtering with a first filter may be performed only once, or may be performed two or more times. In the case of performing filtering two or more times by using another filter in combination, it is preferable that the pore sizes of the second filter and subsequent filters are equal to or smaller than the pore size of the first filter. It is also acceptable that first filters having different pore sizes within the above-mentioned range are combined. Regarding the pore size as used herein, the nominal values provided by filter manufacturers can be referred to. A commercially available filter can be selected from various filters supplied by, for example, Pall Corporation, Advantec Toyo Kaisha, Ltd., Nihon Entegris K.K. (Formerly Nippon Microlith Co., Ltd.), Kitz Microfilter Corporation, and the like.

<Applications>

The photocurable composition of the invention can be used as a UV ink or a UV adhesive. Furthermore, the photocurable composition of the invention can be used as a material for producing recording media such as an optical disc, or optical components such as an antireflection film, a color filter, a diffraction grating, relief hologram, a microlens array, and an optical waveguide. Furthermore, the photocurable composition can be used as a resist material for producing a semiconductor integrated circuit, a microelectromechanical system (MEMS), a sensor element, an imprint mold, a bit patterned medium (BPM) or the like. Since the photocurable composition of the invention has excellent etching resistance, the photocurable composition is particularly suitable as a resist material for imprint lithography. Furthermore, since the photocurable composition of the invention has excellent inkjet jetting accuracy, the photocurable composition is particularly suitable as a UV (ultraviolet) inkjet ink or a photocurable composition for imprint for inkjet coating.

<Pattern Forming Method>

Next, the pattern forming method of the invention will be explained. According to the pattern forming method of the invention, a pattern is formed by a photo-imprint method using the photocurable composition of the invention.

More specifically, the pattern forming method of the invention includes a step of applying the photocurable composition of the invention on a base material or a mold having a pattern; a step of interposing the photocurable composition between the mold and the base material; a step of irradiating the photocurable composition with light in a state of being interposed between the mold and the base material and thereby curing the photocurable composition; and a step of detaching the mold.

Furthermore, according to the invention, it is preferable that the photocurable composition is applied on the base material or the mold having a pattern by an inkjet method.

As a method of applying the photocurable composition of the invention on a base material or a mold having a pattern, a coating film, liquid droplets, or the like can be disposed on the base material using a generally well-known method, for example, a dip coating method, an air knife coating method, a curtain coating method, a wire bar coating method, a gravure coating method, an extrusion coating method, a spin coating method, a slit scanning method, or an inkjet method. Particularly, since the photocurable composition of the invention has excellent inkjet jetting accuracy, an inkjet method is suitable.

At the time of interposing the photocurable composition of the invention between a mold and a base material, helium gas may be introduced in between the mold and the base material. By using such a method, permeation of gases through the quartz mold can be accelerated, and elimination of residual air bubbles can be accelerated. Furthermore, inhibition of radical polymerization during exposure to light can be suppressed by reducing dissolved oxygen in the photocurable composition. Instead of helium, a condensable gas may also be introduced in between the mold and the base material. By using such a method, elimination of residual air bubbles can be further accelerated by utilizing the characteristic that the condensable gas introduced therein condenses and the volume of the gas decreases. A condensable gas refers to a gas that condenses under the action of temperature or pressure, and for example, trichlorofluoromethane or 1,1,1,3,3-pentafluoropropane can be used. In regard to the condensable gas, for example, the descriptions of paragraph 0023 of JP2004-103817A and paragraph 0003 of JP2013-254783A can be referred to, the disclosures of which are incorporated herein by reference.

During the exposure, it is desirable that the exposure illuminance is adjusted to the range of 1 to 200 mW/cm$^2$. By adjusting the exposure illuminance to 1 mW/cm$^2$ or higher, the exposure time can be shortened, and therefore, productivity is enhanced. By adjusting the exposure illuminance to 200 mW/cm$^2$ or lower, side reactions can be suppressed, and there is a tendency that deterioration of the characteristics of the cured film can be suppressed. It is desirable that the amount of exposure is adjusted to the range of 5 to 1,000 mJ/cm$^2$.

During the exposure, in order to suppress the inhibition of radical polymerization by oxygen, it is preferable that an inert gas such as nitrogen, helium, argon, or carbon dioxide is caused to flow, and the oxygen concentration in the atmosphere is controlled to be 10 kPa or less. More preferably, the oxygen concentration in the atmosphere is 3 kPa or less, and even more preferably 1 kPa.

The pattern forming method of the invention may include a step of curing the photocurable composition of the invention by light irradiation and then applying heat to the cured pattern as necessary to further cure the pattern. In a case in which the photocurable composition of the invention is cured by heating after light irradiation, the heating temperature is preferably 150° C. to 280° C., and more preferably 200° C. to 250° C. The heating time is preferably 5 to 60 minutes, and more preferably 15 to 45 minutes.

Specific examples of the pattern forming method include the methods described in paragraphs 0125 to 0136 of JP2012-169462A, the disclosure of which is incorporated herein by reference.

The pattern forming method of the invention can be applied to a pattern reversal method. Specifically, a resist pattern is formed by the pattern forming method of the invention on a substrate to be processed, which includes a carbon film (SOC (Spin On Carbon)). Next, the resist pattern is coated with a Si-containing film (SOG (Spin on Glass)), and then the top of the Si-containing film is etched back to expose the resist pattern. The resist pattern thus exposed is removed by oxygen plasma or the like, and thereby a reverse pattern of the Si-containing film is formed. Furthermore, the carbon film underneath the Si-containing film is etched by using the reverse pattern of the Si-containing film as an etching mask, and thereby the reverse pattern is transferred to the carbon film. Finally, the method includes subjecting the base material to etching processing by using the carbon film having the reverse pattern transferred thereto as an etching mask. Regarding examples of such a method, JP1993-267253A (JP-H05-267253A), JP2002-110510A, paragraphs 0016 to 0030 of JP2006-521702A, and JP2010-541193A can be referred to, the disclosures of which are incorporated herein by reference.

The pattern forming method of the invention may include a step of applying an underlayer film composition on a base material and forming an underlayer film; a step of applying the photocurable composition of the invention on the surface of the underlayer film; a step of irradiating the photocurable composition of the invention and the underlayer film with light in a state of being interposed between a base material and a mold having a pattern, and thereby curing the photocurable composition of the invention; and a step of detaching the mold. Furthermore, it is also acceptable that after the underlayer film composition is applied on a base material, a portion of the underlayer film composition is cured by heating or light irradiation, and then the photocurable composition of the invention is applied.

The underlayer film composition may be, for example, a composition including a curable main agent. The curable main agent may be thermally curable or photocurable, and a thermally curable main agent is preferred. The molecular weight of the curable main agent is preferably 400 or more. The curable main agent may be a low-molecular weight compound or a polymer; however, a polymer is preferred. The molecular weight of the curable main agent is preferably 500 or more, more preferably 1,000 or more, and even more preferably 3,000 or more. The upper limit of the molecular weight is preferably 200,000 or less, more preferably 100,000 or less, and even more preferably 50,000 or less. By adjusting the molecular weight to be 400 or more, volatilization of the component can be suppressed more effectively. Regarding the curable main agent, for example, a polymer containing a constitutional unit represented by the following general formula as a main component can be used:

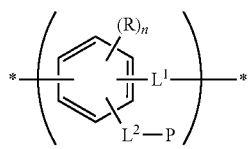

where in the general formula, R represents an alkyl group; $L^1$ and $L^2$ each represent a divalent linking group; P represents a polymerizable group; and n represents an integer from 0 to 3.

R is preferably an alkyl group having 1 to 5 carbon atoms, and more preferably a methyl group.

$L^1$ is preferably an alkylene group, more preferably an alkylene group having 1 to 3 carbon atoms, and even more preferably —$CH_2$—.

$L^2$ is preferably a divalent linking group formed from —$CH_2$—, —O—, —CHR (where R represents a substituent)-, and a combination of two or more of these. R is preferably an OH group.

P is preferably a (meth)acryloyl group, and more preferably an acryloyl group.

n is preferably an integer from 0 to 2, and more preferably 0 or 1.

Examples of commercially available products include NK OLIGO EA-7140/PGMAc (manufactured by Shin Nakamura Chemical Co., Ltd.). Other examples include the compounds described in paragraphs 0040 to 0056 of JP2009-503139A, the disclosure of which is incorporated herein by reference.

The content of the curable main agent is preferably 30% by mass or more, more preferably 50% by mass or more, and even more preferably 70% by mass or more, with respect to all the components except for the solvent in the underlayer film composition. The upper limit is not particularly limited; however, the upper limit may be 100% by mass. Two or more kinds of curable main agents may be used, and in this case, it is preferable that the total amount of the compounds is in the above-mentioned range.

It is preferable that the underlayer film composition includes a solvent. A preferred solvent is a solvent having a boiling point at normal pressure of 80° C. to 200° C. Regarding the type of the solvent, any solvent capable of dissolving the underlayer film composition can all be used; however, preferred is a solvent having one or more of any of an ester structure, a ketone structure, a hydroxyl group, and an ether structure. Specifically, a preferred solvent is a single solvent or mixed solvent selected from propylene glycol monomethyl ether acetate, cyclohexanone, 2-heptanone, gamma-butyrolactone, propylene glycol monomethyl ether, and ethyl lactate, and a solvent including propylene glycol monomethyl ether acetate is particularly preferable from the viewpoint of coating uniformity.

The content of the solvent in the underlayer film composition is optimally adjusted according to the viscosity of the components except for the solvent, coatability, and the intended film thickness; however, from the viewpoint of improving coatability, the solvent can be added in an amount in the range of 70% by mass or more, preferably 90% by mass or more, more preferably 95% by mass or more, and even more preferably 99% by mass or more in the underlayer film composition. The upper limit is not particularly limited; however, for example, the upper limit can be set to 99.9% by mass or less.

The underlayer film composition may include at least one of a surfactant, a thermal polymerization initiator, a polymerization inhibitor, and a catalyst, as other components. The amount of incorporation of these is preferably 50% by mass or less with respect to all the components except for the solvent.

Regarding the underlayer film composition, for example, the compositions described in paragraph 0017 to 0054 of JP2014-192178A or paragraph 0017 to 0068 of JP2014-

024322 can also be used, the disclosures of which are incorporated herein by reference.

The underlayer film composition can be prepared by mixing the various components described above. After the various components described above are mixed, it is preferable to filter the mixture through, for example, a filter having a pore size of 0.003 μm to 5.0 μm. Filtration may be carried out in multiple stages, or may be repeated several times. Furthermore, the liquid that has been filtered can also be re-filtered. Regarding the filter, the filter described above for the preparation of the photocurable composition may be used.

Examples of the method of applying the underlayer film composition include a dip coating method, an air knife coating method, a curtain coating method, a wire bar coating method, a gravure coating method, an extrusion coating method, a spin coating method, a slit scanning method, and an inkjet method. After the underlayer film composition is applied on the base material, it is preferable that the underlayer film composition is dried. A preferred drying temperature is 70° C. to 130° C. Preferably, curing is performed by means of active energy (preferably, heat and/or light). Preferably, curing by heating is performed at a temperature of 150° C. to 250° C. The step of drying the solvent and the step of performing curing may be carried out simultaneously. As such, it is preferable that after the underlayer film composition is applied, and after a portion of the underlayer film composition is cured by heating or light irradiation, the photocurable composition of the invention is applied. In a case in which such a means is employed, at the time of photocuring of the photocurable composition of the invention, the underlayer film composition is also completely cured, and the adhesiveness tends to be further increased.

The film thickness of the underlayer film may vary depending on the usage applications; however, the film thickness is about 0.1 nm to 100 nm, preferably 1 to 20 nm, and more preferably 2 to 10 nm. Furthermore, it is preferable that the underlayer film composition may be applied by multiple coating. It is preferable that the underlayer film thus obtained is made smooth as far as possible.

The base material (substrate or support) can be selected depending on various applications, and examples include quartz, glass, an optical film, a ceramic material, a vapor deposited film, a magnetic film, a reflective film; a metal base material such as Ni, Cu, Cr or Fe; paper; a polymer base material such as a polyester film, a polycarbonate film, or a polyimide film; a thin film transistor (TFT) array base material, an electrode plate of a plasma display (PDP); a conductive base material such as ITO (Indium Tin Oxide) or a metal; an insulating base material such as glass or a plastic; and a semiconductor production base material such as silicon, silicon nitride, polysilicon, silicon oxide, amorphous silicon, SOG (Spin On Glass), or SOC (Spin On Carbon), without any particular limitations.

<Pattern>

As explained above, a pattern formed according to the pattern forming method of the invention can be used as a permanent film used in liquid crystal displays (LCDs) or as an etching resist for semiconductor processing.

For example, the pattern can be preferably used for the production of a semiconductor integrated circuit, a microelectromechanical system (MEMS); optical devices including a recording medium such as an optical disc or a magnetic disc, a light-receiving element such as a solid-state imaging device, and a light emitting element such as a light emitting diode (LED) or organic electroluminescence (EL); optical components such as a diffraction grafting, relief hologram, an optical waveguide, an optical filter, and a microlens array; members for flat panel displays, such as a thin film transistor, an organic transistor, a color filter, an antireflection film, a polarizing element, an optical film, and a columnar material; a nanobiodevice, an immunoassay chip, a deoxyribonucleic acid (DNA) separation chip, a microreactor, a photonic liquid crystal, a guide pattern for micropattern formation using self-organization of a block copolymer (directed self-assembly, DSA), and the like.

Furthermore, the pattern obtainable using the photocurable composition of the invention also has satisfactory solvent resistance. It is preferable that the pattern has high resistance to solvent; however, a pattern that is used in general substrate production steps, for example, a pattern that does not cause fluctuations in the film thickness in the case of being immersed in N-methylpyrrolidone solvent at 25° C. for 10 minutes, is particularly preferred.

A pattern formed according to the pattern forming method of the invention is particularly useful as an etching resist. In a case in which the photocurable composition of the invention is utilized as an etching resist, a fine pattern in the order of nanometers is formed on a base material according to the pattern forming method of the invention. Subsequently, etching is performed using an etching gas such as hydrogen fluoride in the case of wet etching, or using an etching gas such as $CF_4$ in the case of dry etching, and thereby a desired pattern can be formed on the base material. The photocurable composition of the invention has satisfactory etching resistance against dry etching, for which carbon fluoride or the like is used.

<Method for Manufacturing Device>

The method for manufacturing a device of the invention includes the pattern forming method described above. That is, the invention discloses a method for manufacturing a device, the method including a step of etching the base material by using a pattern produced by the pattern forming method as a mask.

The pattern may be included in the device as a permanent film. Furthermore, a base material may be subjected to an etching treatment using the pattern as an etching mask. For example, a base material is subjected to dry etching using the pattern as an etching mask, and the upper layer part of the base material is selectively removed. A device may be manufactured by repeatedly subjecting the base material to such a treatment. Examples of the device include semiconductor devices such as an LSI (large-scale integrated circuit).

EXAMPLES

Hereinafter, the invention will be described more specifically by way of Examples. The materials, amounts of use, proportions, content of treatment, treatment procedure, and the like disclosed in the following Examples may be modified as appropriate, as long as the gist of the invention is maintained. Therefore, the scope of the invention is not intended to be limited to the specific examples described below.

(Synthesis Example 1) Synthesis of Monofunctional Acrylate (A1-1)

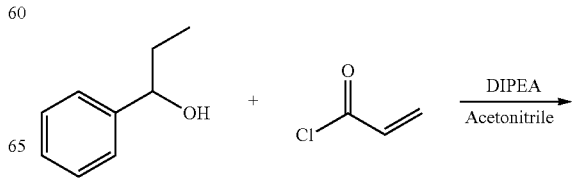

-continued

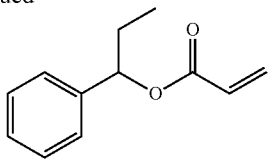

To a mixed solution of 27.2 g (0.2 mol) of 1-phenyl-1-propanol, 28.4 g (0.22 mol) of N-ethyldiisopropylamine (DIPEA), and 200 mL of acetonitrile, 19.9 g (0.22 mol) of acryloyl chloride was added dropwise, while the internal temperature was maintained at or below 30° C. in a water bath. After completion of the dropwise addition, the mixture was stirred for 1 hour at 25° C., subsequently 200 mL of water and 400 mL of ethyl acetate were added thereto, and liquid partition extraction was performed. The organic layer was washed two times with 200 mL of water, subsequently the organic layer was concentrated under reduced pressure, and thus a crude product was obtained. The crude product thus obtained was purified by silica gel chromatography (hexane:ethyl acetate=9/1 (mass ratio)), and thereby a monofunctional acrylate having an aromatic group (A1-1) was obtained (mass yield 23.2 g, yield 61%).

<Viscosity of Monofunctional (Meth)Acrylate>

The viscosity of the monofunctional (meth)acrylate was measured at 25±0.1° C. using a RE-80L type rotary viscometer manufactured by Toki Sangyo Co., Ltd. The speed of rotation at the time of measurement was set as follows in accordance with viscosity.

TABLE 1

| Viscosity | Optimal speed of rotation |
| --- | --- |
| 0.001~6.076 mPa·s | 100 rpm |
| 6.077~12.15 mPa·s | 50 rpm |
| 12.16~30.38 mPa·s | 20 rpm |
| 30.39~60.76 mPa·s | 10 rpm |
| 60.77~121.5 mPa·s | 5 rpm |
| 121.6~303.8 mPa·s | 2 rpm |
| 303.9~607.6 mPa·s | 1 rpm |
| 607.7~1215 mPa·s | 0.5 rpm |
| 1216~2025 mPa·s | 0.3 rpm |

<Calculation of Ohnishi Parameter (Ohnishi P)>

The Ohnishi parameter (Ohnishi P) of the monofunctional acrylate was calculated by the following Expression (1):

$$\text{Ohnishi P} = \text{Total number of atoms}/(\text{number of carbon atoms} - \text{number of oxygen atoms}) \quad (1)$$

<Measurement of Homopolymer Glass Transition Temperature (Tg)>

To a solution of 5.0 g of monofunctional acrylate (A1-1) obtained in Synthesis Example 1 and 15 mL of 2-butanone, 25 mg of a thermal polymerization initiator, V-65 (manufactured by Wako Pure Chemical Industries, Ltd.) was added, and polymerization was performed by heating and stirring the mixture for 3 hours at 80° C. in a nitrogen atmosphere. The solution thus obtained was added dropwise to 300 mL of methanol, and thus a homopolymer was precipitated and extracted. The homopolymer thus extracted was dried for 4 hours at 60° C. under reduced pressure, and the dried product was used as a sample for Tg measurement.

For the Tg measurement, a differential scanning calorimeter (DSC Q1000 manufactured by TA Instruments, Inc.) was used. About 2 mg of the sample for Tg measurement was packed in an aluminum pan, and measurement was made using the differential scanning calorimeter at a rate of temperature increase of 10° C./min. The inflection point of a DSC (Differential Scanning Calorimetry) curve thus obtained was designated as Tg.

(A1-2) to (A1-11) were synthesized in the same manner as in Synthesis Example 1, and the viscosity, the Ohnishi parameter (Ohnishi P), and the homopolymer Tg were evaluated.

As a comparison, commercially available monomers (R-1) to (R-7) were evaluated.
R-1: VISCOAT #160 manufactured by Osaka Organic Chemical Industry, Ltd.
R-2: VISCOAT #192 manufactured by Osaka Organic Chemical Industry, Ltd.
R-3: ARONIX M-106 manufactured by Toagosei Co., Ltd.
R-4: VISCOAT #155 manufactured by Osaka Organic Chemical Industry, Ltd.
R-5: IBXA manufactured by Osaka Organic Chemical Industry, Ltd.
R-6: MADA manufactured by Osaka Organic Chemical Industry, Ltd.
R-7: NOAA manufactured by Osaka Organic Chemical Industry, Ltd.

TABLE 2

|  |  |  | Viscosity at 25° C. (mPa·s) | Ohnishi P | Homopolymer Tg (° C.) |
| --- | --- | --- | --- | --- | --- |
| Example | A1-1 | 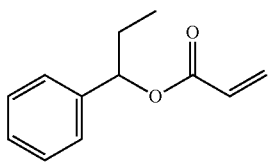 | 4.2 | 2.8 | 30 |
| Example | A1-2 | | 7.3 | 2.8 | 43 |

TABLE 2-continued
| Example | | | Viscosity at 25° C. (mPa·s) | Ohnishi P | Homopolymer Tg (° C.) |
|---|---|---|---|---|---|
| Example | A1-3 | 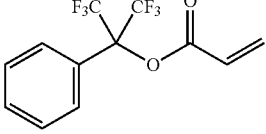 | 15.3 | 2.8 | 79 |
| Example | A1-4 | 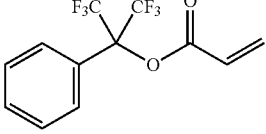 | 8.1 | 2.8 | 79 |
| Example | A1-5 | 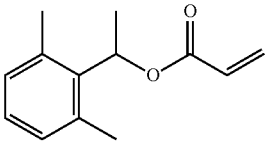 | 19.2 | 2.8 | 51 |
| Example | A1-6 | 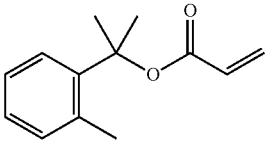 | 8.2 | 2.6 | 29 |
| Example | A1-7 | 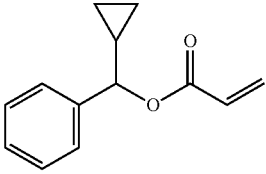 | 10.1 | 2.7 | 42 |
| Example | A1-8 | 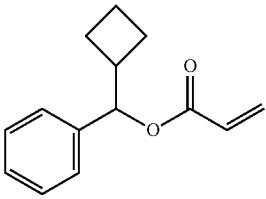 [SMILES: C=CC(=O)OC(c1ccccc1)C1CCC1] | 11.0 | 2.7 | 60 |
| Example | A1-9 | 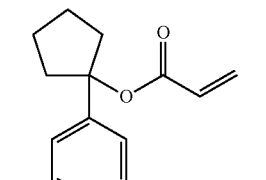 | 7.6 | 2.6 | 55 |
| Example | A1-10 | 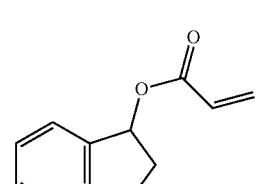 | 14.4 | 2.6 | 67 |

TABLE 2-continued

| | | | Viscosity at 25° C. (mPa·s) | Ohnishi P | Homopolymer Tg (° C.) |
|---|---|---|---|---|---|
| Example | A1-11 | 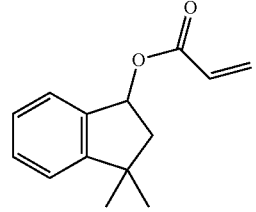 [SMILES: C=CC(=O)OC1CC(C)(C)c2ccccc21] | 12.1 | 2.7 | 60 |
| Comparative Example | R-1 | 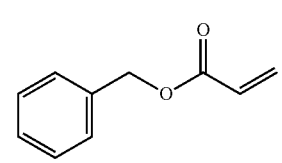 | 2.2 | 2.8 | 6 |
| Comparative Example | R-2 | 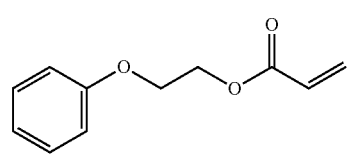 | 8.5 | 3.3 | −22 |
| Comparative Example | R-3 | 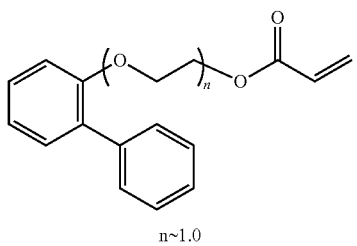 n~1.0 | >75 | 2.6 | −18 |
| Comparative Example | R-4 | 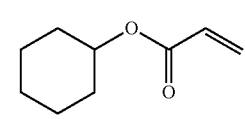 | 2.5 | 3.6 | 15 |
| Comparative Example | R-5 | 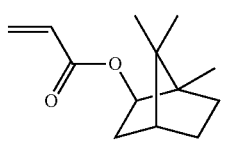 | 7.1 | 3.2 | 81 |
| Comparative Example | R-6 | 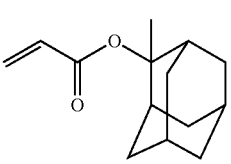 [SMILES: C=CC(=O)OC1(C)C2CC3CC(C2)CC1C3] | 31.7 | 3.0 | 145 |
| Comparative Example | R-7 | 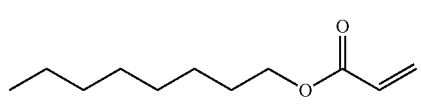 | 2.0 | 3.7 | −65 |

As can be seen clearly from Table 2, monofunctional acrylates represented by General Formula (I), (A1-1) to (A1-11), showed Ohnishi P values of 2.8 or less and homopolymer Tg values of 25° C. or higher.

<Preparation of Photocurable Composition>

A photocurable composition was prepared by mixing a polymerizable compound and a photopolymerization initiator as indicated in the following table, and further adding thereto 4-hydroxy-2,2,6,6-tetramethylpiperidine-1-oxyl free radical (manufactured by Tokyo Chemical Industry Co., Ltd.) as a polymerization inhibitor in an amount of 200 ppm (0.02% by mass) with respect to the polymerizable compound. This was filtered through a polytetrafluoroethylene (PTFE) filter having a pore size of 0.1 μm, and thus a photocurable composition was prepared. In the table, the values are indicated as mass ratios.

The details of the fluorine-containing monofunctional (meth)acrylate, the polyfunctional acrylate having bifunctionality or higher functionality, and the photopolymerization initiator used in the Examples and Comparative Examples are as follows.

<Fluorine-Containing Monofunctional (Meth)Acrylate>
A3-1: manufactured by Unimatec Corporation, FAAC-6
A3-2: synthesized by the following method (Synthesis Example 2)

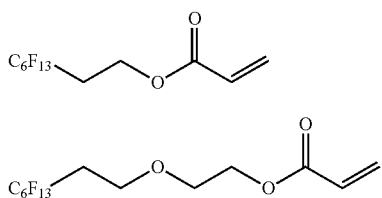

(Synthesis Example 2) Synthesis of Fluorine-Containing Monofunctional Acrylate (A3-2)

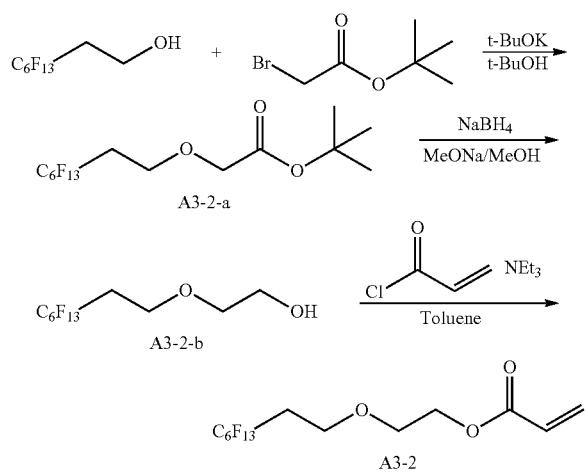

To a solution obtained by dissolving 100 g (0.89 mol) of potassium tert-butoxide in 700 mL of tert-butanol, 316.9 g (0.87 mol) of 3,3,4,4,5,5,6,6,7,7,8,8,8-tridecafluoro-1-octanol was added dropwise, while the internal temperature was maintained at or below 30° C. in a water bath. Thus, an alkoxide solution was prepared.

To a mixed liquid of 171.7 g (0.88 mol) of tert-butyl bromoacetate and 300 mL of tert-butanol, the alkoxide solution previously prepared was added dropwise, while the internal temperature was maintained at or below 30° C. in a water bath. After completion of the dropwise addition, the mixture was stirred for 1 hour at 25° C., subsequently 500 mL of normal hexane and 500 mL of a 0.1 mol/L aqueous solution of hydrochloric acid were added thereto, and liquid partition extraction was performed. The organic layer was washed two times with 500 mL of water and then was concentrated under reduced pressure. Thus, intermediate (A3-2-a) was obtained (mass yield 406.1 g, yield 97.6%).

To a solution obtained by mixing 382.6 g (0.80 mol) of intermediate (A3-2-a) and 800 mL of methanol, 154.3 g of a 28% by mass sodium methoxide solution was added, and then 23.9 g (0.63 mol) of sodium tetrahydroborate was added thereto. The mixture was allowed to react for 4 hours at 40° C. After completion of the reaction, the reaction liquid was slowly added to 1 L of a 2 mol/L aqueous solution of hydrochloric acid so as to decompose any excess sodium tetrahydroborate, subsequently 300 mL of ethyl acetate and 800 mL of n-hexane were added thereto, and liquid partition extraction was performed. The organic layer was washed with 1,000 mL of water and then was concentrated under reduced pressure. The concentrate thus obtained was distilled under reduced pressure, and intermediate (A3-2-b) was obtained (boiling point: 80° C. to 84° C./0.40 kPa, mass yield 326.2 g, yield 99.9%).

To a solution obtained by mixing 326.2 g (0.799 mol) of intermediate (A3-2-b) and 800 mL of toluene, 100.3 g (0.96 mol) of triethylamine was added, and then 83.2 g (0.92 mol) of acryloyl chloride was added dropwise thereto, while the internal temperature was maintained at or below 15° C. in an ice bath. After completion of the dropwise addition, the mixture was stirred for 2 hours, subsequently 800 mL of a 2% by mass aqueous solution of sodium bicarbonate, and liquid partition extraction was performed. The organic layer was washed two times with 800 mL of a 1 mol/L aqueous solution of hydrochloric acid and with 800 mL of water, subsequently 38 mg of 4-hydroxy-2,2,6,6-tetramethylpiperidine-1-oxyl free radical (4-HO-TEMPO) was added thereto, and the mixture was concentrated under reduced pressure. To the concentrate thus obtained, 380 mg of benzoic acid 4-hydroxy-2,2,6,6-tetramethylpiperidine-1-oxyl free radical (4-BzO-TEMPO) was added, and the mixture was distilled under reduced pressure. Thus, the intended fluorine-containing monofunctional acrylate (A3-2) was obtained (boiling point: 107° C./0.67 kPa, mass yield 230.0 g, yield 62.3%).

<Bifunctional (Meth)Acrylate>
B1-1: m-Xylylene diacrylate (synthesized from α,α'-dichloro-m-xylene and acrylic acid)
B1-2: o-Xylylene diacrylate (synthesized from 1,2-benzenedimethanol and acryloyl chloride)
B1-3: Trans-1,2-cyclohexanediol diacrylate (synthesized from trans-1,2-cyclohexanediol and acryloyl chloride)
B2-1: manufactured by Kyoeisha Chemical Co., Ltd., LIGHT ACRYLATE NP-A
B2-2: Cis-2-butene-1,4-diol diacrylate (synthesized from cis-2-butene-1,4-diol and acryloyl chloride)

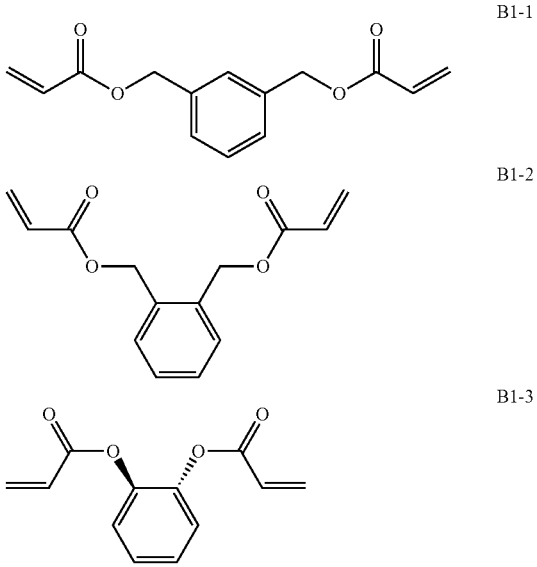

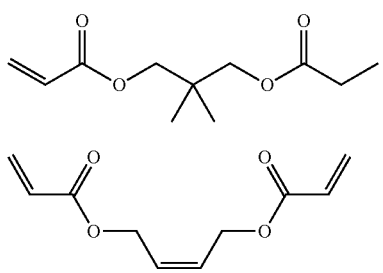

B2-1

B2-2

<Photopolymerization Initiator>
C-1: manufactured by BASF SE, IRGACURE 819
C-2: manufactured by BASF SE, IRGACURE 907
<Viscosity of Photocurable Composition>

The viscosities at 23° C. of the photocurable compositions of the invention and the comparative photocurable compositions were measured at 23±0.1° C. using a RE-80L type rotary viscometer manufactured by Toki Sangyo Co., Ltd. The speed of rotation at the time of measurement was adjusted to be as follows according to the viscosity. The results are presented in the column "Viscosity (mPa·s)" in Tables 4 and 5.

TABLE 3

| Viscosity | Optimal speed of rotation |
|---|---|
| 0.001~6.076 mPa · s | 100 rpm |
| 6.077~12.15 mPa · s | 50 rpm |
| 12.16~30.38 mPa · s | 20 rpm |
| 30.39~60.76 mPa · s | 10 rpm |
| 60.77~121.5 mPa · s | 5 rpm |
| 121.6~303.8 mPa · s | 2 rpm |
| 303.9~607.6 mPa · s | 1 rpm |
| 607.7~1215 mPa · s | 0.5 rpm |
| 1216~2025 mPa · s | 0.3 rpm |

<Calculation of Ohnishi Parameter of Photocurable Composition>

The Ohnishi parameter (Ohnishi P) was calculated by the following Expression (1).

Ohnishi P=Total number of atoms/(number of carbon atoms−number of oxygen atoms)  (1)

The results are presented in the column "Ohnishi P" in Tables 4 and 5.

<Glass Transition Temperature of Cured Film of Photocurable Composition (Cured Film Tg)>

A photocurable composition was interposed between quartz plates and was cured by ultraviolet radiation (UV) (light source: high-pressure mercury lamp, wavelength: 300 to 400 nm, illuminance: 10 mW/cm², exposure time: 100 s), and thus a cured film (film thickness 150 μm) was produced.

A short strip sample (width 5 mm) of the cured film was used to measure the dynamic viscoelasticity in the tensile sinusoidal mode using a dynamic viscoelasticity analyzer, DMS-6100 (manufactured by Seiko Instruments, Inc.) (distance between chucks: 20 mm, temperature range: 20° C. to 220° C., rate of temperature increase: 5° C./min, frequency: 1 Hz). The temperature at the maximum value of the loss tangent (tan δ) curve thus obtained was designated as glass transition temperature (Tg).

The results are presented in the column "Cured film Tg (° C.)" in Tables 4 and 5.

<Breakage of Pattern after Etching (Breakage after Etching)>

The state of breakage of a pattern was evaluated from a SEM image of a sample after etching, which was obtained as described above. The results are presented in the column "Line breakage after etching" in Tables 4 and 5.

A: Tapering and breakage of lines were not observed over the entire surface.

B: Tapering of lines was observed in some regions; however, breakage of lines was not observed.

C: Breakage of lines was observed in some regions.

D: Breakage of lines was observed over the entire surface.

<Change in Line Width Roughness (ΔLWR)>

A quartz mold having lines and spaces with a line width of 30 nm and a depth of 60 nm was used. A photocurable composition was applied on a silicon wafer using an inkjet apparatus (inkjet printer DMP-2831 manufactured by FUJIFILM Dimatix, Inc.), and the photocurable composition was interposed between the wafer and the above-mentioned mold in a helium atmosphere. The photocurable composition was cured by exposing the composition to light through the quartz mold face using a high-pressure mercury lamp under the conditions of 100 mJ/cm², and then the quartz mold was released. Thus, a pattern of a cured film was obtained.

The pattern of a cured film thus obtained was exposed to a reactive ion etching atmosphere in an etching apparatus. For the etching gas, a $CHF_3/CF_4/Ar$ mixed gas was selected, and the sample was cooled to 20° C. during etching.

The top face of the pattern before etching and after etching was observed with a scanning electron microscope (SEM) (magnification ratio: 100,000 times), and the line width roughness (LWR) was measured from the images thus obtained. The difference of LWR values before and after etching (ΔLWR) was calculated. The unit was nm. The results are presented in the column "ΔLWR" in Tables 4 and 5.

ΔLWR=(LWR after etching)−(LWR before etching)

A: ΔLWR≤1.0
B: 1.0<ΔLWR≤2.5
C: 2.5<ΔLWR≤3.0
D: 3.0<ΔLWR

<Inkjet (IJ) Jetting Accuracy>

A photocurable composition having its temperature adjusted to 23° C. was applied on a silicon wafer using an inkjet printer, DMP-2831 (manufactured by Fujifilm Dimatix, Inc.), by jetting the photocurable composition in a liquid droplet amount of 1 pl per nozzle, such that the liquid droplets were arranged in a square array at an interval of 100 μm on the silicon wafer.

An observation of 2,500 dots in an area which measured 5 mm on each side on the coated substrate was made, and any discrepancies from the square array were measured.

Thus, the standard deviation σ was calculated. The inkjet jetting accuracy was evaluated according to the following criteria of grades A to E. The results are presented in the column "IJ jetting accuracy" in Tables 4 and 5.

A: σ<3 m
B: 3 μm≤σ<5 μm
C: 5 μm≤σ<10 μm
D: 10 μm≤σ
E: There were nozzles incapable of jetting out.

TABLE 4

|  | Example X-1 | Example X-2 | Example X-3 | Example X-4 | Example X-5 | Example X-6 | Example X-7 | Example X-8 | Example X-9 | Example X-10 |
|---|---|---|---|---|---|---|---|---|---|---|
| A1-1 | 48 | | | | | | | | | |
| A1-2 | | 48 | | | | | | | | |
| A1-3 | | | 48 | | | | | | | |
| A1-4 | | | | 48 | | | | | | |
| A1-5 | | | | | 48 | | | | | |
| A1-6 | | | | | | 48 | | | | |
| A1-7 | | | | | | | 48 | | | |
| A1-8 | | | | | | | | 48 | | |
| A1-9 | | | | | | | | | 48 | |
| A1-10 | | | | | | | | | | 48 |
| A1-11 | | | | | | | | | | |
| A3-1 | 2 | 2 | 2 | 2 | 2 | 2 | 2 | 2 | 2 | 2 |
| A3-2 | | | | | | | | | | |
| B1-1 | | | | | | | | | | |
| B1-2 | | | | | | | | | | |
| B1-3 | | | | | | | | | | |
| B2-1 | 48 | 48 | 48 | 48 | 48 | 48 | 48 | 48 | 48 | 48 |
| B2-2 | | | | | | | | | | |
| C-1 | 2 | 2 | 2 | 2 | 2 | 2 | 2 | 2 | 2 | 2 |
| Viscosity (mPa · s) | 6.4 | 8.0 | 12.0 | 8.4 | 13.9 | 8.4 | 9.4 | 9.8 | 8.1 | 11.5 |
| Ohnishi P | 3.6 | 3.6 | 3.6 | 3.6 | 3.6 | 3.5 | 3.6 | 3.6 | 3.5 | 3.5 |
| Cured film Tg (° C.) | 85 | 92 | 110 | 110 | 96 | 85 | 91 | 100 | 98 | 104 |
| Line breakage after etching | B | B | B | B | B | B | B | B | B | B |
| ΔLWR | B | B | A | A | B | B | B | B | B | B |
| IJ jetting accuracy | C | A | C | A | C | A | B | B | A | C |

|  | Example X-11 | Example X-12 | Example X-13 | Example X-14 | Example X-15 | Example X-16 | Example X-17 | Example X-18 | Example X-19 |
|---|---|---|---|---|---|---|---|---|---|
| A1-1 | | | | | | | | | |
| A1-2 | | | | | | | | | |
| A1-3 | | | | | | | | | |
| A1-4 | | 49 | 48 | 48 | 48 | 48 | 73 | 48 | 23 |
| A1-5 | | | | | | | | | |
| A1-6 | | | | | | | | | |
| A1-7 | | | | | | | | | |
| A1-8 | | | | | | | | | |
| A1-9 | | | | | | | | | |
| A1-10 | | | | | | | | | |
| A1-11 | 48 | | | | | | | | |
| A3-1 | 2 | | | 2 | 2 | 2 | 2 | 2 | 2 |
| A3-2 | | | 2 | | | | | | |
| B1-1 | | | | | | | 23 | 48 | 73 |
| B1-2 | | | | | | 48 | | | |
| B1-3 | | | | | 48 | | | | |
| B2-1 | 48 | 49 | 48 | | | | | | |
| B2-2 | | | | 48 | | | | | |
| C-1 | 2 | 2 | 2 | 2 | 2 | 2 | 2 | 2 | 2 |
| Viscosity (mPa · s) | 10.4 | 8.4 | 8.4 | 7.2 | 12.4 | 13.1 | 10.0 | 10.4 | 10.8 |
| Ohnishi P | 3.6 | 3.6 | 3.6 | 3.6 | 3.4 | 3.0 | 2.9 | 3.0 | 3.1 |
| Cured film Tg (° C.) | 100 | 112 | 108 | 107 | 130 | 125 | 101 | 122 | 144 |
| Line breakage after etching | B | B | B | B | B | A | A | A | A |
| ΔLWR | B | A | A | A | A | A | B | A | A |
| IJ jetting accuracy | B | C | A | A | C | C | B | B | C |

TABLE 5

| | Comparative Example Y-1 | Comparative Example Y-2 | Comparative Example Y-3 | Comparative Example Y-4 | Comparative Example Y-5 | Comparative Example Y-6 | Comparative Example Y-7 |
|---|---|---|---|---|---|---|---|
| R-1 | 48 | | | | | | |
| R-2 | | 48 | | | | | |
| R-3 | | | 48 | | | | |
| R-4 | | | | 48 | | | |
| R-5 | | | | | 48 | | |
| R-6 | | | | | | 48 | |
| R-7 | | | | | | | 48 |
| A3-1 | 2 | 2 | 2 | 2 | 2 | 2 | 2 |
| B2-1 | 48 | 48 | 48 | 48 | 48 | 48 | 48 |
| C-1 | 2 | 2 | 2 | 2 | 2 | 2 | 2 |
| Viscosity (mPa · s) | 5.4 | 8.6 | 67 | 5.6 | 7.9 | 20 | 5.3 |
| Ohnishi P | 3.6 | 3.9 | 3.5 | 4.0 | 3.8 | 3.7 | 4.1 |
| Cured film Tg (° C.) | 73 | 59 | 61 | 78 | 111 | 143 | 38 |
| Line breakage after etching | B | C | B | D | C | C | D |
| ΔLWR | C | D | D | C | A | A | D |
| IJ jetting accuracy | D | B | E | D | A | E | D |

As is clearly seen from the results, the photocurable compositions of Examples (X-1) to (X-19) could suppress both the breakage of a pattern after etching and the deformation of the line width roughness (ΔLWR) after etching.

In contrast, the photocurable compositions of Comparative Examples (Y-2), (Y-4), (Y-5), (Y-6), and (Y-7) could not suppress breakage of a pattern after etching.

Furthermore, the photocurable compositions of Comparative Examples (Y-1), (Y-2), (Y-3), (Y-4), and (Y-7) had large values of ΔLWR and could not suppress deformation of the line width roughness after etching.

In regard to Examples X-1 to X-19, evaluations were carried out similarly except that the photopolymerization initiator was changed to IRGACURE 907, and effects similar to those of Examples X-1 to X-19 were obtained.

What is claimed is:

1. A photocurable composition comprising:
    a monofunctional (meth)acrylate represented by the following General Formula (I);
    a photopolymerization initiator; and
    a polyfunctional (meth)acrylate at a proportion of 20 to 79% by mass with respect to all the components except for a solvent in the photocurable composition:

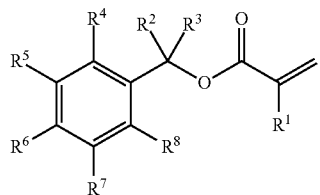

(I)

wherein $R^1$ represents a hydrogen atom or a methyl group,
$R^2$ represents an alkyl group which may be substituted with a fluorine atom,
$R^3$ represents a hydrogen atom, a linear alkyl group which may be substituted with a fluorine atom, or a branched alkyl group which may be substituted with a fluorine atom,
$R^4$ to $R^8$ each independently represent a hydrogen atom, a halogen atom, a linear alkyl group having 1 to 4 carbon atoms, or a branched alkyl group having 3 or 4 carbon atoms,
the total number of carbon atoms included in $R^2$ and $R^3$ is 1 to 6, and
$R^2$ and $R^3$ may be bonded to each other and form a ring.

2. The photocurable composition according to claim 1, wherein in General Formula (I), $R^4$ represents a linear alkyl group having 1 to 4 carbon atoms, or a branched alkyl group having 3 or 4 carbon atoms.

3. The photocurable composition according to claim 1, wherein in General Formula (I), $R^3$ represents a hydrogen atom.

4. The photocurable composition according to claim 1, wherein in General Formula (I), $R^2$ and $R^3$ each independently represent a methyl group which may be substituted with a fluorine atom.

5. The photocurable composition according to claim 1, wherein the photocurable composition comprises the monofunctional (meth)acrylate at a proportion of 20 to 80% by mass with respect to all the components except for a solvent in the photocurable composition.

6. The photocurable composition according to claim 1, wherein the polyfunctional (meth)acrylate has an aromatic group.

7. The photocurable composition according to claim 1, wherein the Ohnishi parameter of the photocurable composition is 3.6 or less, and the glass transition temperature of a cured film of the photocurable composition is 85° C. or higher; provided that the glass transition temperature of the cured film is a value measured by the following method:
    the photocurable composition is interposed between quartz plates and is cured with ultraviolet radiation using a high-pressure mercury lamp as a light source under the conditions of a wavelength of 300 to 400 nm, an illuminance of 10 mW/cm², and an exposure time of 100 seconds, thereby a cured film in the form of a short strip sample having a film thickness of 150 μm and a width of 5 mm is produced, the dynamic viscoelasticity of the short strip sample is measured in the tensile sinusoidal mode using a dynamic viscoelasticity analyzer under the conditions of a distance between chucks of 20 mm, a temperature range of 20° C. to 220° C., a rate of temperature increase of 5° C./min, and a frequency of 1 Hz, and the temperature at the maximum value of a loss tangent curve thus obtained is designated as the glass transition temperature; and the Ohnishi parameter is a value represented by the following Expression (1):

Ohnishi parameter=Total number of atoms/(number of carbon atoms−number of oxygen atoms)    (1).

8. The photocurable composition according to claim 1, wherein the viscosity at 23° C. of the photocurable composition is 5.5 to 15.0 mPa·s.

9. The photocurable composition according to claim 1 for use in imprints.

10. A pattern forming method, comprising:
- applying the photocurable composition according to claim 1 on either a base material or a mold having a pattern;
- interposing the photocurable composition between the mold to which the photocurable composition has been applied and the base material, or between the mold having a pattern and the base material to which the photocurable composition has been applied;
- irradiating the photocurable composition with light in a state of being interposed between the mold and the base material and thereby curing the photocurable composition; and
- detaching the mold.

11. The pattern forming method according to claim 10, wherein the photocurable composition is applied on the base material or the mold having a pattern, by an inkjet method.

12. A method for manufacturing a device, the method comprising the steps of:
- (1) preparing a pattern employing the pattern forming method of claim 10; and
- (2) etching the base material employing the pattern as a mask.

* * * * *